(12) United States Patent
Seo et al.

(10) Patent No.: US 11,244,989 B2
(45) Date of Patent: Feb. 8, 2022

(54) DISPLAY DEVICE

(71) Applicant: Samsung Display Co., Ltd., Yongin-si (KR)

(72) Inventors: Seungwoo Seo, Hwaseong-si (KR); Seungjae Lee, Suwon-si (KR); Ji Hwang Lee, Hwaseong-si (KR); Sohra Han, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/928,869

(22) Filed: Jul. 14, 2020

(65) Prior Publication Data

US 2021/0126057 A1 Apr. 29, 2021

(30) Foreign Application Priority Data

Oct. 24, 2019 (KR) .................. 10-2019-0133196

(51) Int. Cl.
*G06F 3/044* (2006.01)
*H01L 27/32* (2006.01)
*H01L 51/52* (2006.01)

(52) U.S. Cl.
CPC .......... *H01L 27/323* (2013.01); *G06F 3/0446* (2019.05); *H01L 27/3246* (2013.01); *H01L 51/5253* (2013.01)

(58) Field of Classification Search
CPC . G06F 3/0446; H01L 27/323; H01L 27/3246; H01L 27/3258; H01L 51/5246; H01L 51/5253
USPC ................................................. 345/170–178
See application file for complete search history.

(56) References Cited

U.S. PATENT DOCUMENTS

| 9,601,717 | B2 | 3/2017 | Lee et al. |
| 2013/0241873 | A1* | 9/2013 | Kim ................. G06F 3/04164 345/174 |
| 2015/0370380 | A1* | 12/2015 | Hong ................... G06F 3/044 345/174 |
| 2016/0307971 | A1 | 10/2016 | Jeon |

(Continued)

FOREIGN PATENT DOCUMENTS

| EP | 3276463 A1 | 1/2018 |
| EP | 3301550 A1 | 4/2018 |

(Continued)

OTHER PUBLICATIONS

EPO Search Report dated Mar. 22, 2021 for corresponding European Application No. 20203273.6-1212 (8 pages).

*Primary Examiner* — Tony O Davis
(74) *Attorney, Agent, or Firm* — Lewis Roca Rothgerber Christie LLP

(57) ABSTRACT

A display device includes a base layer, a circuit layer, a light emitting element layer, and a thin film encapsulation layer. The base layer includes a display area and a non-display area. The circuit layer includes a plurality of insulating layers, at least one of which has an opening. The light emitting element layer includes a light emitting area overlapping the display area, a valley area overlapping the opening and having a concave shape, and a peak area overlapping the non-display area and being on the circuit layer. The thin film encapsulation layer includes an organic encapsulation layer that covers the light emitting area, the valley area, and at least a portion of the peak area.

29 Claims, 23 Drawing Sheets

(56) References Cited

U.S. PATENT DOCUMENTS

| | | | |
|---|---|---|---|
| 2017/0207418 A1 | 7/2017 | Shin | |
| 2017/0277313 A1* | 9/2017 | Lee | G06F 1/1686 |
| 2017/0301877 A1 | 10/2017 | Kim et al. | |
| 2017/0364194 A1* | 12/2017 | Jang | H01L 27/3262 |
| 2018/0101270 A1* | 4/2018 | Cho | G06F 3/0412 |
| 2018/0284505 A1* | 10/2018 | Ye | G02F 1/1343 |
| 2019/0025956 A1* | 1/2019 | Lee | G06F 3/0448 |
| 2019/0198587 A1 | 6/2019 | Park et al. | |
| 2019/0223289 A1* | 7/2019 | Kim | G02F 1/136277 |
| 2019/0265827 A1* | 8/2019 | Liu | G06F 3/0412 |
| 2019/0332210 A1* | 10/2019 | Lee | G06F 3/044 |
| 2020/0012388 A1* | 1/2020 | Zhong | G06F 3/0446 |
| 2020/0159350 A1* | 5/2020 | Yang | G06F 3/04164 |
| 2020/0285347 A1* | 9/2020 | Ma | G09G 3/36 |
| 2020/0293134 A1* | 9/2020 | Shim | G06F 3/0443 |
| 2020/0326799 A1* | 10/2020 | Moon | G06F 3/0412 |
| 2020/0341590 A1* | 10/2020 | Li | H01L 51/5228 |

FOREIGN PATENT DOCUMENTS

| | | |
|---|---|---|
| EP | 3321965 A1 | 5/2018 |
| KR | 10-2018-0062155 A | 6/2018 |
| KR | 20180134802 A | 12/2018 |
| KR | 10-2019-0075503 A | 7/2019 |
| KR | 10-2019-0076093 A | 7/2019 |

* cited by examiner

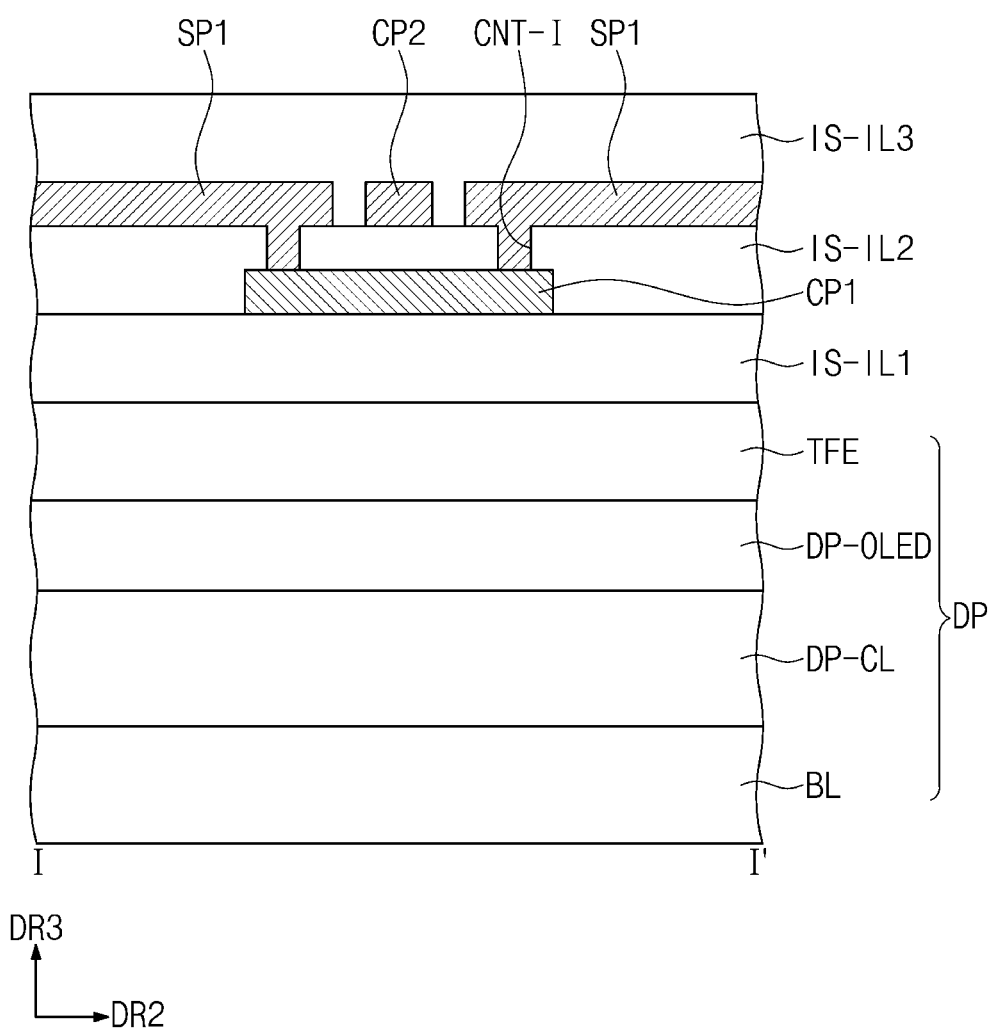

DISPLAY DEVICE

CROSS-REFERENCE TO RELATED APPLICATION

This application claims priority to and the benefit of Korean Patent Application No. 10-2019-0133196, filed on Oct. 24, 2019, the entire content of which is hereby incorporated by reference in its entirety.

BACKGROUND

1. Field

One or more aspects of embodiments of the present disclosure relate to a display device. More particularly, one or more aspects of embodiments of the present disclosure relate to a display device including an input sensor.

2. Description of the Related Art

Various display devices that are applied to multimedia devices, such as televisions, mobile phones, tablet computers, navigation devices, and/or game devices, are being developed. The display devices include pixels providing images, a thin film encapsulation layer covering the pixels, and an input sensor on the thin film encapsulation layer.

The thin film encapsulation layer includes an organic layer and an inorganic layer. The organic layer is formed by curing a liquid organic material. A structure that controls the spread of the organic material to allow the organic material having fluidity to be formed in a desired area is being developed.

In recent years, research has been ongoing to reduce a dead space of a display panel in the display device, and substantially simultaneously, developments related to an organic material spreading structure are being required (or desired) to prevent (or reduce the possibility of) the organic material of the organic layer from overflowing outside the display panel.

SUMMARY

One or more aspects of embodiments of the present disclosure are directed toward a display device having a reduced dead space.

One or more aspects of embodiments of the present disclosure provide a display device capable of effectively (or suitably) blocking (or reducing) a flow of an organic encapsulation layer of a thin film encapsulation layer.

Embodiments of the present disclosure provide a display device including a base layer including a display area and a non-display area defined adjacent to the display area, a circuit layer on the base layer and including a plurality of insulating layers of which at least one layer is with an opening defined therethrough and overlapping the non-display area, a light emitting element layer on the circuit layer and including a light emitting area of which at least a portion overlaps the display area, a valley area overlapping the opening and having a concave shape, and a peak area overlapping the non-display area, and a thin film encapsulation layer on the light emitting element layer and including an organic encapsulation layer covering the light emitting area and the valley area and covering at least a portion of the peak area. The light emitting element layer includes a light emitting element including a first electrode on the circuit layer, a light emitting layer on the first electrode, and a second electrode on the light emitting layer, and a pixel definition layer exposing a portion of the first electrode.

The display device further includes an input sensor on the thin film encapsulation layer and including a plurality of sensing electrodes and a plurality of signal lines connected to the plurality of sensing electrodes. A signal line at an outermost position of the non-display area among the signal lines overlaps the valley area.

The plurality of insulating layers include a first insulating layer with the opening defined therethrough and a second insulating layer on the first insulating layer to cover the opening, a portion of the second insulating layer having a concave shape and overlapping the opening, and the valley area is defined on the portion of the second insulating layer which has the concave shape.

The plurality of insulating layers include a first insulating layer and a second insulating layer with the opening defined therethrough and on the first insulating layer, and the valley area is defined on a portion of the first insulating layer exposed through the opening.

The display device further includes a peak portion on the base layer and overlapping the peak area, the peak portion includes a plurality of layers, and at least one of the plurality of layers of the peak portion is formed through the same process as that of one of the pixel definition layer or the plurality of insulating layers.

The display device further includes a dam overlapping the peak area and spaced apart from the peak portion, the dam includes a plurality of layers, and at least one of the plurality of layers of the dam is formed through the same process as that of one of the plurality of insulating layers or the pixel definition layer.

The thin film encapsulation layer further includes a first inorganic encapsulation layer and a second inorganic encapsulation layer, the organic encapsulation layer is between the first inorganic encapsulation layer and the second inorganic encapsulation layer, and the first inorganic encapsulation layer and the second inorganic encapsulation layer contact each other in at least a portion of the peak portion.

The valley area includes an insulating pattern, the insulating pattern includes a plurality of layers, at least one of the plurality of layers of the insulating pattern is formed through the same process as that of one of the pixel definition layer or the plurality of insulating layers, and a distance from the base layer to the insulating pattern is smaller than a distance from the base layer to the peak portion.

The insulating pattern includes a first insulating pattern and a second insulating pattern spaced apart from the first insulating pattern.

The insulating pattern contacts the peak portion.

The light emitting layer and the pixel definition layer are in the light emitting area.

The light emitting layer is in the light emitting area, and the pixel definition layer is in the light emitting area, the valley area, and the peak area.

Embodiments of the present disclosure provide a display device including a base layer including a display area and a non-display area adjacent to the display area, a plurality of insulating layers of which at least one layer is with an opening defined therethrough and overlapping the non-display area, a light emitting element of which at least a portion overlaps the display area and is on the plurality of insulating layers, a pixel definition layer on the plurality of insulating layers and including a light emitting area, a valley area overlapping the opening and having a concave shape, and a peak area overlapping the non-display area, and a thin film encapsulation layer on the light emitting element and including an organic encapsulation layer covering the light emitting area, the valley area, and at least a portion of the peak area.

The display device further includes an input sensor on the thin film encapsulation layer and including a plurality of sensing electrodes and a plurality of signal lines connected to the plurality of sensing electrodes. A signal line of the plurality of signal lines at an outermost position of the non-display area overlaps the valley area.

The light emitting element includes a first electrode on the plurality of insulating layers, a light emitting layer on the first electrode and overlapping the display area, and a second electrode on the light emitting layer, and the pixel definition layer exposes a portion of the first electrode in the light emitting area.

The plurality of insulating layers include a first insulating layer with the opening defined therethrough and a second insulating layer on the first insulating layer to cover the opening, a portion of the second insulating layer has a concave shape overlapping the opening, and the valley area is defined on the portion of the second insulating layer which has the concave shape.

The plurality of insulating layers include a first insulating layer and a second insulating layer with the opening defined therethrough and on the first insulating layer, and the valley area is defined on a portion of the first insulating layer exposed through the opening.

The display device further includes a peak portion on the base layer and overlapping the peak area, the peak portion includes a plurality of layers, and at least one of the plurality of layers of the peak portion is formed through the same process as that of one of the pixel definition layer or the plurality of insulating layers.

The thin film encapsulation layer includes a first inorganic encapsulation layer, an organic encapsulation layer, and a second inorganic encapsulation layer, which are sequentially arranged on the base layer, the organic encapsulation layer covers a portion of the peak portion, the valley area, and the light emitting element, and the first inorganic encapsulation layer and the second inorganic encapsulation layer contact each other in at least a portion of the peak portion.

The valley area includes an insulating pattern, and a distance from the base layer to the insulating pattern is smaller than a distance from the base layer to the peak portion.

The pixel definition layer is provided with a hole defined therethrough in the valley area.

Embodiments of the present disclosure provide a display device including a base layer including a display area and a non-display area adjacent to the display area, a circuit layer on the base layer and including a plurality of insulating layers, a light emitting element overlapping the display area and including a first electrode, a light emitting layer, and a second electrode, which are on the circuit layer, a pixel definition layer on the plurality of insulating layers and exposing the first electrode, a peak portion in the non-display area and to be spaced apart from the light emitting element, a thin film encapsulation layer covering the peak portion, the light emitting element, and the pixel definition layer, a plurality of sensing electrodes on the thin film encapsulation layer, and a plurality of signal lines connected to the plurality of sensing electrodes. At least one insulating layer among the plurality of insulating layers is provided with an opening defined therethrough and overlapping the non-display area, an area defined between the peak portion and the light emitting element and overlapping the opening is defined as a valley area, and at least one signal line among the plurality of signal lines overlaps the valley area.

The thin film encapsulation layer includes a first inorganic encapsulation layer, an organic encapsulation layer, and a second inorganic encapsulation layer, which are sequentially arranged on the base layer, the organic encapsulation layer covers a portion of the peak portion, the valley area, and the light emitting element, and the first inorganic encapsulation layer and the second inorganic encapsulation layer contact each other in at least a portion of the peak portion.

The plurality of insulating layers include a first insulating layer through which the opening is defined and a second insulating layer on the first insulating layer to cover the opening, a portion of the second insulating layer has a concave shape overlapping the opening, and the valley area is defined on the portion of the second insulating layer which has the concave shape.

The plurality of insulating layers include a first insulating layer and a second insulating layer provided with the opening defined therethrough and on the first insulating layer, and the valley area is defined on a portion of the first insulating layer exposed through the opening.

The peak portion includes a plurality of layers, and at least one of the plurality of layers of the peak portion is formed through the same process as that of one of the pixel definition layer or the plurality of insulating layers.

The valley area includes an insulating pattern, the insulating pattern includes a plurality of layers, at least one of the plurality of layers of the insulating pattern is formed through the same process as that of one of the pixel definition layer or the plurality of insulating layers, and a distance from the base layer to the insulating pattern is smaller than a distance from the base layer to the peak portion.

The insulating pattern includes a first insulating pattern and a second insulating pattern spaced apart from the first insulating pattern.

The valley area includes an insulating pattern, and the insulating pattern has a concave shape.

According to the above, the dead space of the display device may be reduced.

In addition, the flow of the encapsulation layer that forms the thin film encapsulation layer may be effectively (or suitably) blocked (or reduced).

BRIEF DESCRIPTION OF THE DRAWINGS

The above and other advantages of the present disclosure will become readily apparent by reference to the following detailed description when considered in conjunction with the accompanying drawings wherein:

FIG. 5C is a cross-sectional view taken along a line I-I' of FIG. 5B;

DETAILED DESCRIPTION

Figure 1A:
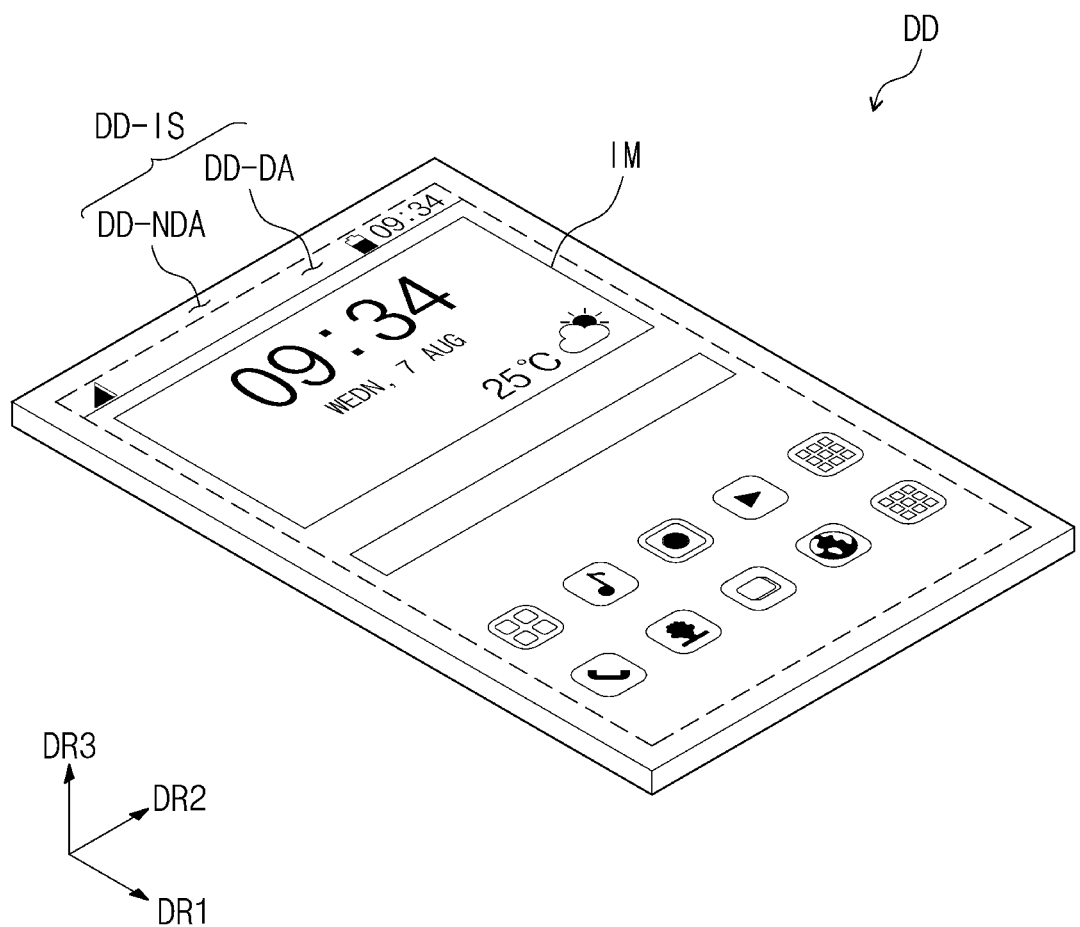
FIG. 1A is a perspective view showing a display device according to an example embodiment of the present disclosure.

The present disclosure may be variously modified and realized in many different forms, and thus specific embodiments will be exemplified in the drawings and described in more detail hereinbelow. However, the present disclosure should not be limited to the specific disclosed forms, and be construed to include all modifications, equivalents, or replacements included in the spirit and scope of the present disclosure.

Like numerals refer to like elements throughout. In the drawings, the thickness, ratio, and dimension of components are exaggerated for effective description of the technical content. As used herein, the term "and/or" includes any and all combinations of one or more of the associated listed items. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the present disclosure, it will be understood that when an element such as a layer, film, region, or substrate is referred to as being "on" another element, it may be "directly on" the other element (with any intervening elements therebetween) or intervening elements may also be present. Similarly, it will be understood that when an element such as a layer, film, region, or substrate is referred to as being "under" another element, it may be "directly under" the other element (with any intervening elements therebetween) or intervening elements may also be present. In addition, the term "on" in the present disclosure may mean that a portion of an element is positioned at a lower portion as well as an upper portion of another element.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Meanwhile, in the present disclosure, when an element is referred to as being "directly connected" to another element, there are no intervening elements present between a layer, film region, and/or substrate and another layer, film, region, and/or substrate. For example, the term "directly connected" may mean that two layers or two members are connected without employing additional adhesive therebetween.

Hereinafter, example embodiments of the present disclosure will be described with reference to accompanying drawings.

Figure 1B:
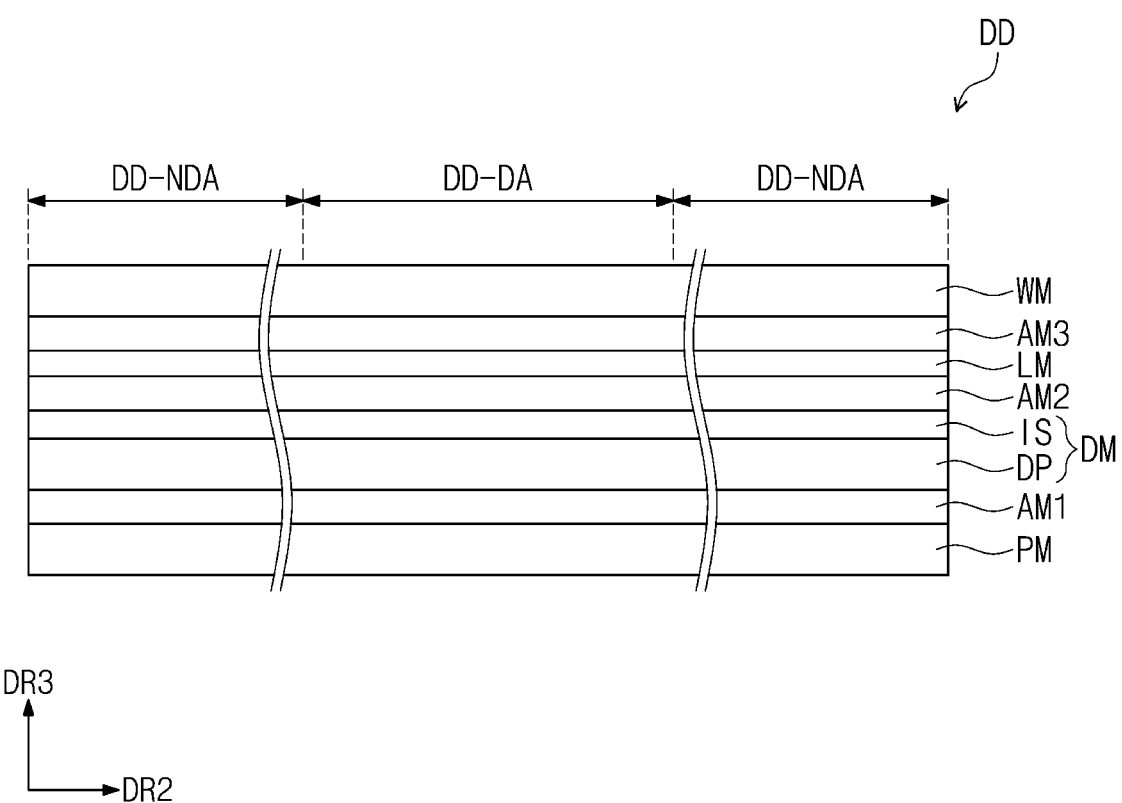
FIG. 1B is a cross-sectional view showing a display device according to an example embodiment of the present disclosure.

FIG. 1A is a perspective view showing a display device DD according to an example embodiment of the present disclosure. FIG. 1B is a cross-sectional view showing the display device DD according to an example embodiment of the present disclosure.

Referring to FIG. 1A, the display device DD may include a display surface DD-IS. The display surface DD-IS may include a display area DD-DA and a non-display area DD-NDA defined therein. The display area DD-DA may be an area through which an image IM is displayed. FIG. 1A shows application icons as the image IM. The non-display area DD-NDA may be an area through which the image IM is not displayed. Pixels may be arranged in the display area DD-DA and may not be arranged in the non-display area DD-NDA. The pixels may refer to effective pixels that provide the image IM.

The display area DD-DA is substantially parallel to a surface defined by a first direction DR1 and a second direction DR2. A third direction DR3 indicates a normal line direction of the display area DD-DA, i.e., a thickness direction of the display device DD. Front (or upper) and rear (or lower) surfaces of each member are distinguished from each other by the third direction DR3. However, directions indicated by the first, second, and third directions DR1, DR2, and DR3 are relative to each other and may be changed to other directions.

FIG. 1A shows the display device DD that may be applied to a mobile phone terminal as a representative example. In some embodiments, electronic modules, a camera module, and a power module, which are mounted on a main board, may be placed on a bracket/a case with the display device DD to form the mobile phone terminal. The display device DD according to the present disclosure may be applied to a large-sized electronic item, such as a television set and/or a monitor, and a small and/or medium-sized electronic item, such as a tablet computer, a car navigation unit, a game unit, and/or a smart watch.

A bezel area of the display device DD may be defined by the non-display area DD-NDA. The non-display area DD- NDA may be defined adjacent to the display area DD-DA. The non-display area DD-NDA may surround the display area DD-DA. However, according to another example embodiment, the non-display area DD-NDA and the display area DD-DA may have shapes designed relative to each other. According to another example embodiment, the non-display area DD-NDA may be omitted.

In the example embodiment of the present disclosure, the display device DD includes a flat-shaped display surface DD-IS, however, the display surface DD-IS should not be limited to the flat shape. The display device DD may include a curved display surface or a three-dimensional display surface. The three-dimensional display surface may include a plurality of display areas facing different directions from each other.

Referring to FIG. 1B, the display device DD may include a window WM, an optical layer LM, a display module DM, a protective film PM, a first adhesive layer AM1, a second adhesive layer AM2, and a third adhesive layer AM3. The display module DM may be between the protective film PM and the optical layer LM. The optical layer LM may be between the display module DM and the window WM. The first adhesive layer AM1 attaches the display module DM to the protective film PM, the second adhesive layer AM2 attaches the display module DM to the optical layer LM, and the third adhesive layer AM3 attaches the optical layer LM to the window WM. In some embodiments, the first adhesive layer AM1, the second adhesive layer AM2, and/or the third adhesive layer AM3 may be omitted.

The protective film PM may protect the display module DM. The protective film PM may provide (include) an external surface exposed to the outside and an adhesive surface attached to the first adhesive layer AM1. The protective film PM may prevent or reduce external moisture from entering the display module DM and may substantially absorb external impacts.

The window WM may protect the display module DM from the external impacts and may provide an input surface to a user. The window WM may include a plastic film as its base member. The window WM may have a multi-layer structure. The base member of the window WM may have a multi-layer structure selected from a glass substrate, a plastic film, and a plastic substrate. The window WM may further include a bezel pattern. The multi-layer structure may be formed through successive processes or adhesive processes using adhesives. Further, the window WM may further include a functional layer on the base member. The functional layer may include a hard coating layer, an anti-fingerprint layer, an anti-reflective layer, and/or a self-healing layer.

The optical layer LM may reduce a reflectance of an external light incident thereto. The optical layer LM may include at least a polarizer. The optical layer LM may further include a retarder. According to an embodiment of the present disclosure, the optical layer LM may be omitted.

The display module DM may include a display panel DP and an input sensor IS. The display panel DP may be an organic light emitting display panel, however, it should not be particularly limited. For instance, the display panel DP may be a quantum dot light emitting display panel that is another kind of self-emissive display panel. A light emitting layer of the quantum dot light emitting display panel may include a quantum dot and/or a quantum rod. Hereinafter, the organic light emitting display panel will be described as a representative example of the display panel DP.

The input sensor IS is directly on the display panel DP. In the present disclosure, "directly on" means being formed through successive processes, as opposed to being attached using a separate adhesive layer.

The display panel DP may generate the image IM (refer to FIG. 1A) corresponding to image data input thereto. In the present example embodiment, the organic light emitting display panel is described as a representative example, however, the display panel should not be limited to the organic light emitting display panel.

The input sensor IS may obtain coordinate information of the external input. For instance, the input sensor IS may sense the external input by a capacitive method. The operation of the input sensor IS should not be particularly limited. For example, the input sensor IS may sense the external input by an electromagnetic induction method and/or a pressure sensing method.

In some embodiments, the display module DM according to the example embodiment of the present disclosure may further include an anti-reflective layer. The anti-reflective layer may include a color filter or a stacked structure of a conductive layer/an insulating layer/a conductive layer. The light incident to (on) the display module DM from the outside may be absorbed, destructively interfered, and/or polarized by the anti-reflective layer, and thus, the reflectance of the external light may be reduced. The function of the optical layer LM may be replaced with the anti-reflective layer.

Each of the first adhesive layer AM1, the second adhesive layer AM2, and the third adhesive layer AM3 may be an organic adhesive layer, such as an optically clear adhesive (OCA) film, an optically clear resin (OCR), and/or a pressure sensitive adhesive (PSA) film. The organic adhesive layer may include an adhesive material, such as a polyurethane-based adhesive, a polyacrylic-based adhesive, a polyester-based adhesive, a polyepoxy-based adhesive, and/or a polyvinyl acetate-based adhesive.

In some embodiments, the display device DD may further include a frame structure that supports the above-mentioned components, depending on the shape of the display panel. For example, in a case where a display device includes a foldable display panel, the frame structure may have a joint structure or a hinge structure.

Figure 2A:
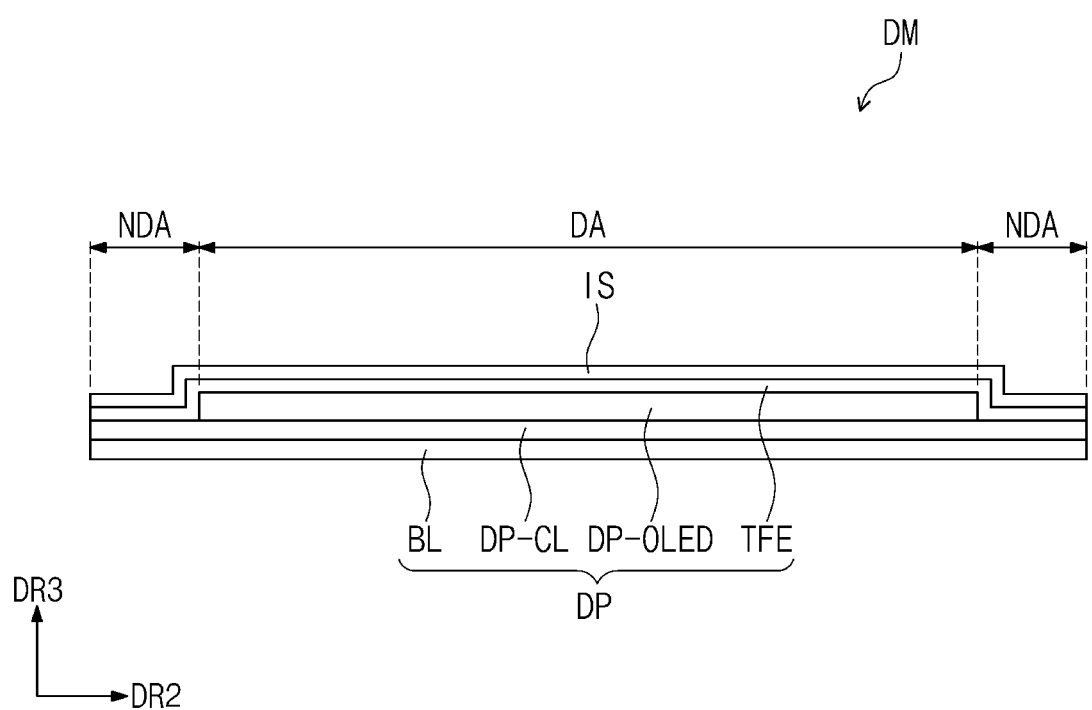
FIG. 2A is a cross-sectional view showing a display module according to an example embodiment of the present disclosure.
Figure 2B:
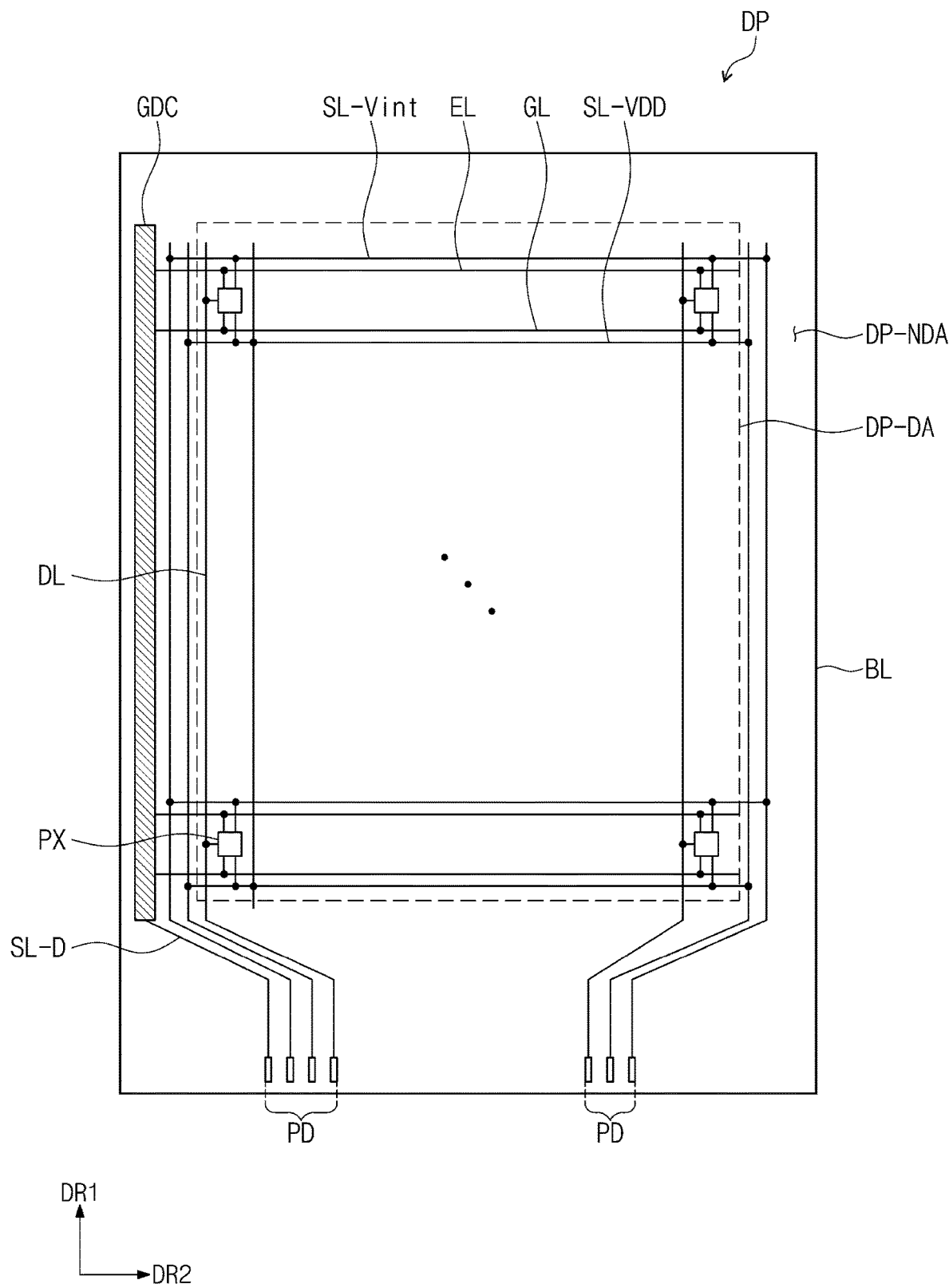
FIG. 2B is a plan view showing a display panel according to an example embodiment of the present disclosure.
Figure 3A:
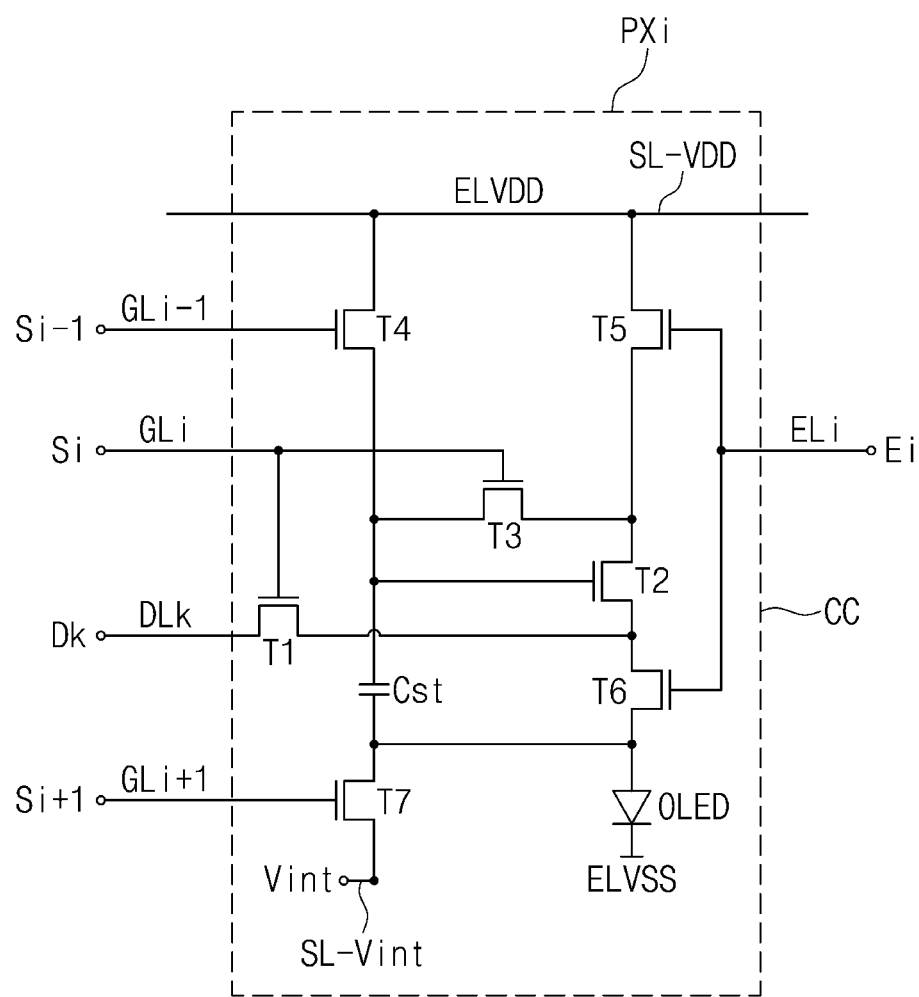
FIG. 3A is an equivalent circuit diagram showing a pixel according to an example embodiment of the present disclosure.
Figure 3B:
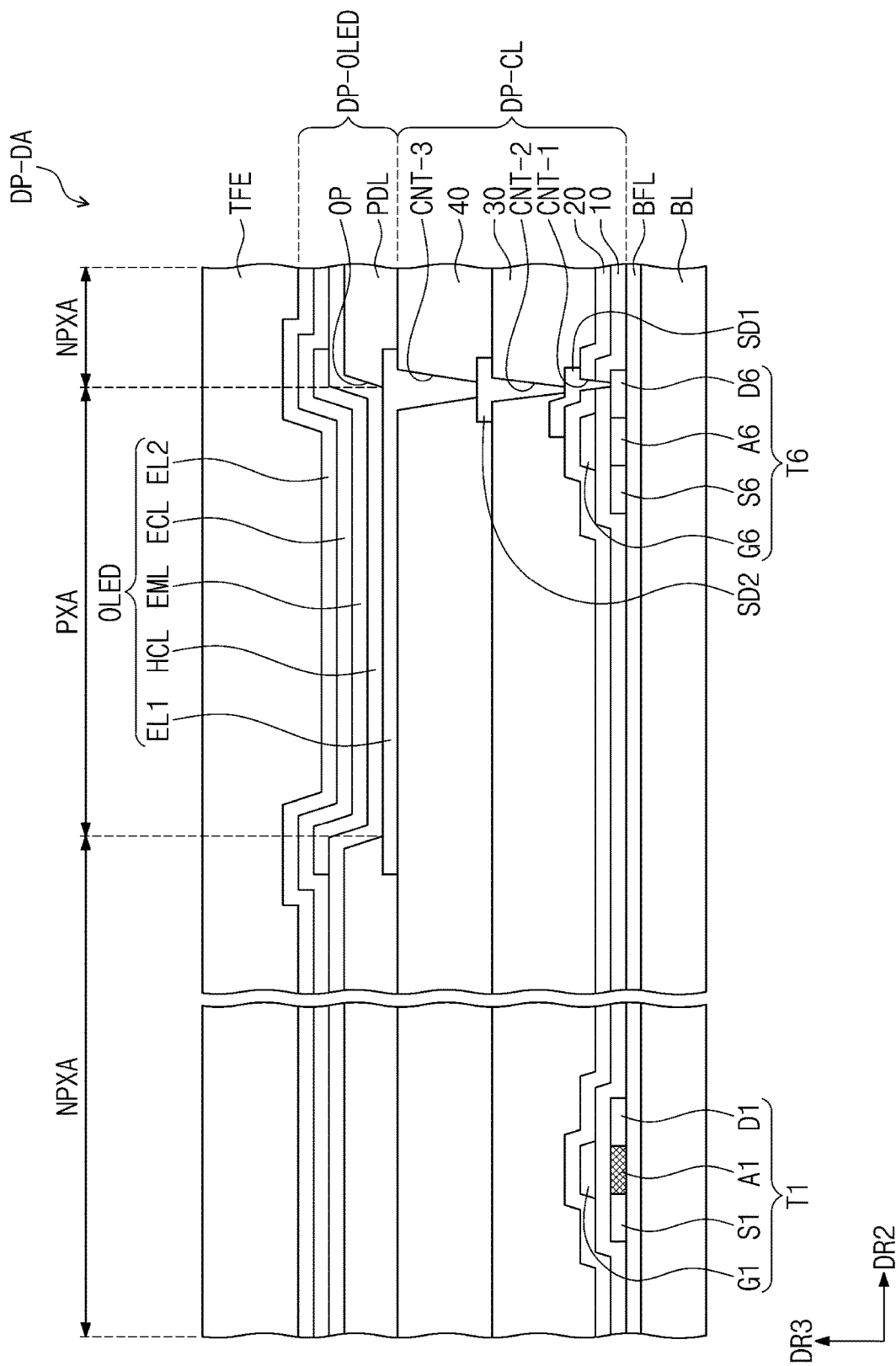
FIG. 3B is an enlarged cross-sectional view showing a display panel according to an example embodiment of the present disclosure.

FIG. 2A is a cross-sectional view showing the display module DM according to an example embodiment of the present disclosure. FIG. 2B is a plan view showing the display panel DP according to an example embodiment of the present disclosure. FIG. 3A is an equivalent circuit diagram showing a pixel PXi according to an example embodiment of the present disclosure. FIG. 3B is an enlarged cross-sectional view showing the display panel DP according to an example embodiment of the present disclosure.

Referring to FIG. 2A, the display module DM may include the display panel DP and the input sensor IS. The display panel DP may include a base layer BL, a circuit layer DP-CL, a light emitting element layer DP-OLED, and a thin film encapsulation layer TFE which are provided on the base layer BL. The base layer BL may include at least one plastic film. The base layer BL may include a plastic substrate, a glass substrate, a metal substrate, and/or an organic/inorganic composite substrate as a flexible substrate.

The circuit layer DP-CL may include at least one insulating interlayer, a plurality of conductive layers, and a semiconductor layer. The conductive layers of the circuit layer DP-CL may form signal lines or a driving circuit of the pixel. The light emitting element layer DP-OLED may include a light emitting element OLED. The thin film encapsulation layer TFE may encapsulate the light emitting element layer DP-OLED. The thin film encapsulation layer TFE may include an inorganic layer and an organic layer. The thin film encapsulation layer TFE may include at least two inorganic layers and an organic layer between the two inorganic layers. The inorganic layers may protect the light emitting element layer DP-OLED from moisture and oxygen, and the organic layer may protect the light emitting element layer DP-OLED from foreign substance such as dust particles. The inorganic layer may include a silicon nitride layer, a silicon oxynitride layer, a silicon oxide layer, a titanium oxide layer, and/or an aluminum oxide layer. The organic layer may include an acrylic-based organic layer, however, it should not be limited thereto or thereby.

The input sensor IS may be directly on the thin film encapsulation layer TFE. The input sensor IS may include sensing electrodes and signal lines. The sensing electrodes and the signal lines may have a single-layer or a multi-layer structure.

The sensing electrodes and the signal lines may include indium tin oxide (ITO), indium zinc oxide (IZO), zinc oxide (ZnO), indium tin zinc oxide (ITZO), PEDOT, a metal nanowire, and/or a graphene. The sensing electrodes and the signal lines may include a metal layer including, e.g., molybdenum, silver, titanium, copper, aluminum, or any alloy thereof. The sensing electrodes and the signal lines may have the same layer structure or different layer structures. More detailed descriptions of the input sensor IS will be provided later.

As shown in FIG. 2B, the display panel DP may include a display area DA and a non-display area NDA. In the present example embodiment, the non-display area NDA may be defined along an edge of the display area DA. The display area DA and the non-display area NDA of the display panel DP may respectively correspond to the display area DD-DA and the non-display area DD-NDA of the display device DD. The display area DA and the non-display area NDA of the display panel DP may not be necessarily the same as the display area DD-DA and the non-display area DD-NDA of the display device DD, and may be changed depending on structure/design of the display panel DP.

The display panel DP may include a driving circuit GDC, a plurality of signal lines SL-Vint, SL-VDD, EL, GL, DL, and SL-D, a power electrode, and a plurality of pixels PX. An area in which the pixels PX are arranged may be defined as the display area DA.

The driving circuit GDC may include a scan driving circuit GDC. The scan driving circuit GDC may generate a plurality of scan signals and may sequentially output the scan signals to a plurality of scan lines GL. In addition, the scan driving circuit GDC may generate a plurality of light emitting control signals and may sequentially output the light emitting control signals to a plurality of light emitting control lines EL.

In FIG. 2B, the plural scan signals and the plural light emitting control signals are output from one scan driving circuit GDC, however, they should not be limited thereto or thereby. According to another embodiment, a plurality of scan driving circuits may divide and output the plural scan signals and may divide and output the plural light emitting control signals. According to another embodiment, a driving circuit that generates and outputs plural scan signals and a driving circuit that generates and outputs plural light emitting control signals may be provided separately from each other. Another scan driving circuit may be further provided in the display panel DP to face the scan driving circuit GDC shown in FIG. 2B in the second direction DR2.

The scan driving circuit GDC may be included in the circuit layer DP-CL. The scan driving circuit GDC may include a plurality of thin film transistors formed through the same processes as the driving circuit of the pixel PX.

In some embodiments, the display panel DP may further include a data driving circuit coupled to pads PD in a chip-on-film (COF) method. In the example embodiment of the present disclosure, the data driving circuit may be also integrated in the circuit layer DP-CL.

The signal lines GL, DL, EL, SL-VDD, SL-Vint, and SL-D may include the scan lines GL, the light emitting control lines EL, data lines DL, a power line SL-VDD, an initialization voltage line SL-Vint, and a dummy signal line SL-D. The signal lines GL, DL, EL, SL-VDD, SL-Vint, and SL-D may be included in the circuit layer DP-CL, and some lines of the signal lines may be omitted. The pads PD may be connected to ends of the signal lines GL, DL, EL, SL-VDD, SL-Vint, and SL-D.

The scan lines GL may be respectively connected to corresponding pixels among the pixels PX, and the data lines DL may be respectively connected to corresponding pixels among the pixels PX. Each of the light emitting control lines EL may be arranged substantially parallel to a corresponding scan line among the scan lines GL.

The power line SL-VDD may be connected to the pixels PX and may provide a first power voltage to the pixels PX. The power line SL-VDD may include a plurality of lines extending in the first direction DR1 and a plurality of lines extending in the second direction DR2.

The initialization voltage line SL-Vint may provide an initialization voltage to the pixels PX. The initialization voltage line SL-Vint may include a plurality of lines extending in the first direction DR1 and a plurality of lines extending in the second direction DR2.

The dummy signal line SL-D may provide control signals to the scan driving circuit GDC. The dummy signal line SL-D may provide a second power voltage to the power electrode. The second power voltage may have a different level from that of the first power voltage. The second power voltage may have a level lower than that of the first power voltage.

FIG. 3A shows an i-th pixel PXi connected to a k-th data line DLk among a plurality of data lines DL1 to DLm as a representative example. The i-th pixel PXi is activated in response to an i-th scan signal Si applied to an i-th scan line GLi.

The i-th pixel PXi may include a pixel driving circuit CC to control the light emitting element OLED. The light emitting element OLED may emit light at a predetermined (or set) brightness in correspondence with the amount of current supplied from the pixel driving circuit CC. A potential of the first power supply voltage ELVDD may be set higher than a potential of the second power supply voltage EVLSS. The first power supply voltage ELVDD is provided to the voltage line SL-VDD.

The pixel driving circuit may include seven thin film transistors T1 to T7 and one capacitor Cst. However, the pixel driving circuit including the seven thin film transistors T1 to T7 and the one capacitor Cst is merely an example, and the pixel driving circuit may be changed in various ways.

A driving transistor may control a driving current supplied to the light emitting element OLED. An output electrode of a second transistor T2 may be electrically connected to the light emitting element OLED. The output electrode of the second transistor T2 may be connected to the light emitting element OLED via a sixth transistor T6.

The sixth transistor T6 may be connected between an output electrode of a first transistor T1 and a first electrode EL1 (refer to FIG. 3B), that is an anode electrode of the light emitting element OLED. A control electrode of the sixth transistor T6 may be connected to an i-th light emitting control line ELi.

A control electrode of a control transistor may receive a control signal. The control signal applied to the i-th pixel PXi may include an (i−1)th scan signal Si−1, the i-th scan signal Si, an (i+1)th scan signal Si+1, a data signal Dk, and an i-th light emitting control signal Ei. In the example embodiment, the control transistor may include the first transistor T1 and the third to seventh transistors T3 to T7.

The first transistor T1 may include a sensing electrode connected to the k-th data line DLk, a control electrode connected to the i-th scan line GLi, and the output electrode connected to the output electrode of the second transistor T2. The first transistor T1 may be turned on in response to a scan signal Si (hereinafter, referred to as "i-th scan signal") applied to the i-th scan line GLi and may provide the data signal Dk applied to the k-th data line DLk to the capacitor Cst.

Referring to FIG. 3B, the display panel DP may include a plurality of insulating layers, a semiconductor pattern, a conductive pattern, and a signal line. The insulating layer, the semiconductor layer, and the conductive layer may be formed by coating and deposition processes. Then, the insulating layer, the semiconductor layer, and the conductive layer may be selectively patterned by a photolithography process. The semiconductor pattern, the conductive pattern, and the signal line, which are included in the circuit layer DP-CL and the light emitting element layer DP-OLED, may be formed by the above-mentioned method.

The base layer BL may include a synthetic resin layer. The synthetic resin layer may include a heat-curable resin. The base layer BL may have a multi-layer structure. For instance, the base layer BL may have a three-layer structure of the synthetic resin layer, an adhesive layer, and the synthetic resin layer. In some embodiments, the synthetic resin layer may be a polyimide-based resin layer, however, it should not be particularly limited. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, or a perylene-based resin. Further, the base layer BL may include a glass substrate, a metal substrate, and/or an organic/inorganic composite substrate.

At least one inorganic layer may be formed on an upper surface of the base layer BL. The inorganic layer may include at least one of aluminum oxide, titanium oxide, silicon oxide, silicon oxynitride, zirconium oxide, or hafnium oxide. The inorganic layer may be provided in a plural number. The inorganic layers may form a barrier layer and/or a buffer layer. In the present example embodiment, the display panel DP may include the buffer layer BFL.

The buffer layer BFL may improve a cohesive force between the base layer BL and the semiconductor pattern. The buffer layer BFL may include a silicon oxide layer and a silicon nitride layer. The silicon oxide layer and the silicon nitride layer may be alternately stacked with each other.

The semiconductor pattern may be provided on the buffer layer BFL. The semiconductor pattern may include poly-silicon, however, it should not be limited thereto or thereby. The semiconductor pattern may include amorphous silicon and/or metal oxide.

FIG. 3B merely shows some semiconductor patterns, and additional semiconductor patterns may be further provided on other areas of the pixels PX in a plan view. The semiconductor pattern may be arranged in a specific (or set) arrangement over the pixels PX. The semiconductor pattern may have different electrical properties depending on its doping state. The semiconductor pattern may include a doped region and a non-doped region. The doping region may be doped with an N-type dopant or a P-type dopant. A P-type transistor may include a doping region doped with the P-type dopant.

The doping region may have conductivity larger than that of the non-doping region and may substantially serve as an electrode or a signal line. The non-doping region may correspond to an active (or channel) of a transistor. For example, a portion of the semiconductor pattern may be the active of the transistor, another portion of the semiconductor pattern may be a source or drain of the transistor, and the other portion of the semiconductor pattern may be a connection electrode or a connection signal line.

As shown in FIG. 3B, a source S1, an active A1, and a drain D1 of the first transistor T1 may be formed from the semiconductor pattern, and a source S6, an active A6, and a drain D6 of the sixth transistor T6 may be formed from the semiconductor pattern. The sources S1 and S6 and the drains D1 and D6 may extend in opposite directions from the actives A1 and A6 in the cross section. A portion of the connection signal line SCL may be formed from the semiconductor pattern.

A first intermediate insulating layer 10 may be on the buffer layer BFL. The first intermediate insulating layer 10 may commonly overlap the pixels PX and may cover the semiconductor pattern. The first intermediate insulating layer 10 may include an inorganic layer and/or an organic layer, and may have a single-layer or a multi-layer structure. The first intermediate insulating layer 10 may include at least one of aluminum oxide, titanium oxide, silicon oxide, silicon oxynitride, zirconium oxide, or hafnium oxide. In the present example embodiment, the first intermediate insulating layer 10 may be a silicon oxide layer having a single-layer structure. In some embodiments, an insulating layer of the circuit layer DP-CL (to be described later in more detail) may also include an inorganic layer and/or an organic layer and may have a single-layer or a multi-layer structure. The inorganic layer may include at least one of the above-mentioned materials.

Gates G1 and G6 may be provided on the first intermediate insulating layer 10. The gate G1 may be a portion of a metal pattern. The gates G1 and G6 may overlap the actives A1 and A6, respectively. The gates G1 and G6 may act as a mask in a doping process of the semiconductor pattern.

A second intermediate insulating layer 20 may be on the first intermediate insulating layer 10 to cover the gates G1 and G6. The second intermediate insulating layer 20 may commonly overlap the pixels PX. The second intermediate insulating layer 20 may include an inorganic layer and/or an organic layer and may have a single-layer or a multi-layer structure. In the present example embodiment, the second intermediate insulating layer 20 may be a silicon oxide layer having a single-layer structure.

A first connection electrode SD1 may be on the second intermediate insulating layer 20. The first connection electrode SD1 may be connected to the connection signal line SCL through a contact hole CNT-1 defined through the first intermediate insulating layer 10 and the second intermediate insulating layer 20.

A first insulating layer 30 may be on the second intermediate insulating layer 20. The first insulating layer 30 may be, but is not limited to, an organic layer. A second connection electrode SD2 may be on the first insulating layer 30. The second connection electrode SD2 may be connected to the first connection electrode SD1 through a contact hole CNT-2 defined through the first insulating layer 30.

A second insulating layer 40 may be on the first insulating layer 30 to cover the second connection electrode SD2. The second insulating layer 40 may be, but is not limited to, an organic layer. The first electrode EL1 may be on the second insulating layer 40. The first electrode EL1 may be connected to the second connection electrode SD2 through a contact hole CNT-3 defined through the second insulating layer 40. An opening may be defined through a pixel definition layer PDL. At least a portion of the first electrode EL1 may be exposed through the opening of the pixel definition layer PDL.

As shown in FIG. 3B, the display area DP-DA may include a light emitting area PXA and a non-light emitting area NPXA adjacent to the light emitting area PXA. The non-light emitting area NPXA may surround the light emitting area PXA. In the present example embodiment, the light emitting area PXA may be defined to correspond to the portion of the first electrode EL1 exposed through the opening of the pixel definition layer PDL.

A hole control layer HCL may be commonly provided on the light emitting area PXA and the non-light emitting area NPXA. The hole control layer HCL may include a hole transport layer and may further include a hole injection layer. A light emitting layer EML may be on the hole control layer HCL. The light emitting layer EML may be in an area corresponding to the opening. That is, the light emitting layer EML may be formed in each of the pixels after being divided into plural portions.

An electron control layer ECL may be on the light emitting layer EML. The electron control layer ECL may include an electron transport layer and may further include an electron injection layer. The hole control layer HCL and the electron control layer ECL may be commonly formed in plural pixels using an open mask. A second electrode EL2 may be on the electron control layer ECL. The second electrode EL2 may have an integral shape and may be commonly provided in the plural pixels PX.

The thin film encapsulation layer TFE may be on the second electrode EL2. The thin film encapsulation layer TFE may be commonly provided in the pixels PX. In the present example embodiment, the thin film encapsulation layer TFE may directly cover the second electrode EL2. In an example embodiment of the present disclosure, a capping layer may be further provided between the thin film encapsulation layer TFE and the second electrode EL2 to cover the second electrode EL2. In this case, the thin film encapsulation layer TFE may directly cover the capping layer.

Figure 4A:
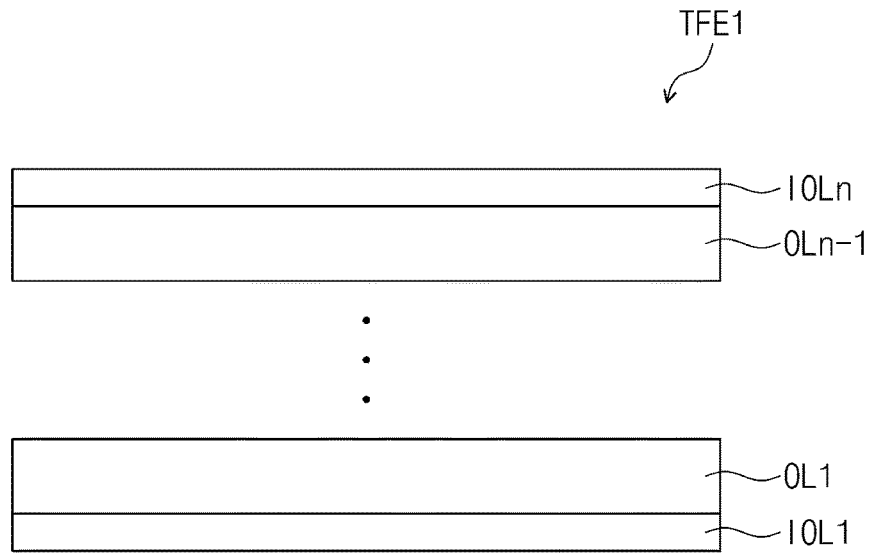
FIGS. 4A to 4C are cross-sectional views showing thin film encapsulation layers according to an example embodiment of the present disclosure.
Figure 4B:
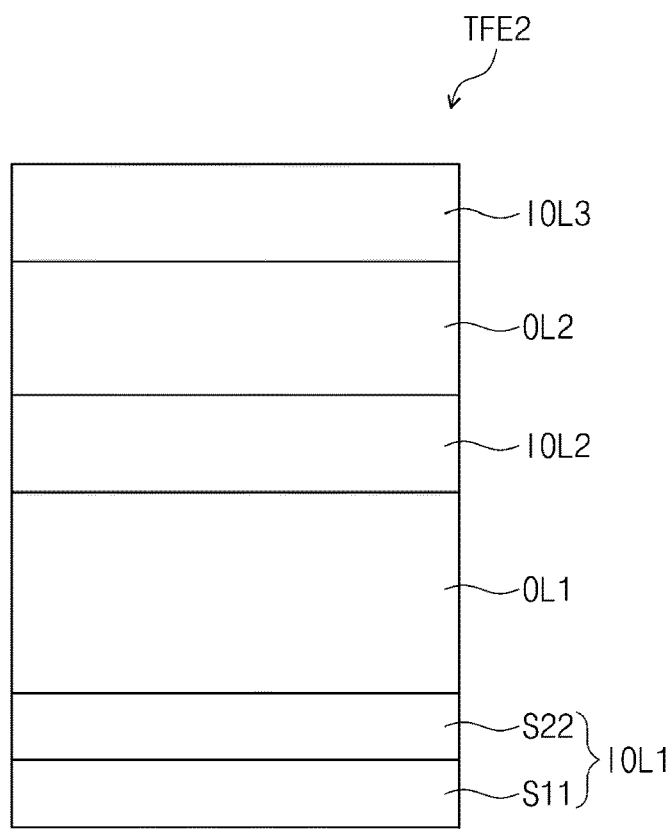
Figure 4C:
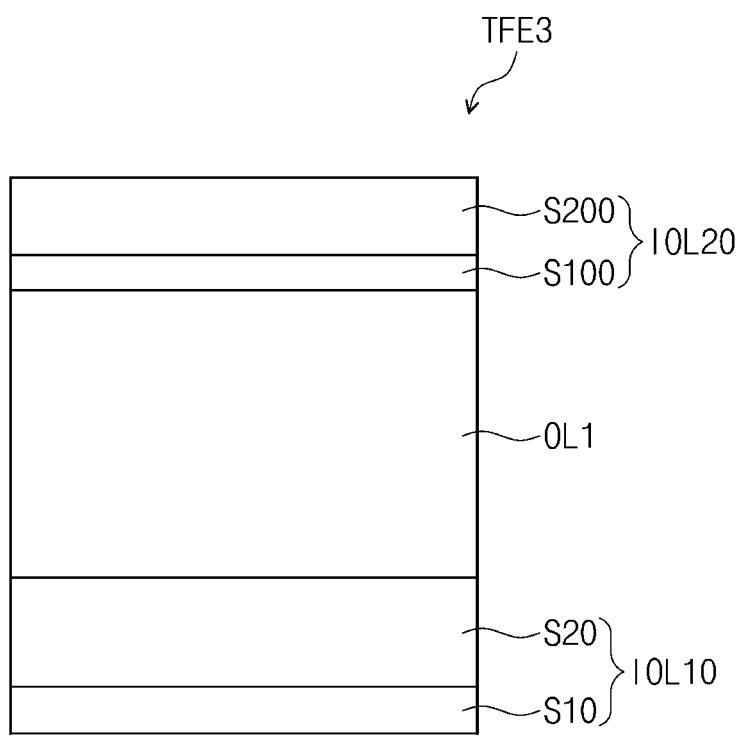

FIGS. 4A to 4C are cross-sectional views respectively showing thin film encapsulation layers TFE1, TFE2, and TFE3 according to an example embodiment of the present disclosure.

Referring to FIG. 4A, the thin film encapsulation layer TFE1 may include n inorganic layers IOL1 to IOLn. The thin film encapsulation layer TFE1 may include n-1 organic layers OL1 to OLn-1, and the n-1 organic layers OL1 to OLn-1 may be alternately stacked with the n inorganic layers IOL1 to IOLn. The n-1 organic layers OL1 to OLn-1 may, on average, have a thickness greater than the n inorganic layers IOL1 to IOLn.

Each of then inorganic layers IOL1 to IOLn may have a single-layer structure of a single material or a multi-layer structure of different materials. Each of the n-1 organic layers OL1 to OLn-1 may be formed by depositing, printing, or coating organic monomers. The organic monomers may include an acrylic-based monomer.

As shown in FIGS. 4B and 4C, inorganic layers included in each of the thin film encapsulation layers TFE2 and TFE3 may include the same material as each other or different inorganic materials from each other, and may have the same thickness as each other or different thicknesses from each other. Organic layers respectively included in the thin film encapsulation layers TFE2 and TFE3 may include the same material as each other or different organic materials from each other, and may have the same thickness as each other or different thicknesses from each other.

As shown in FIG. 4B the thin film encapsulation layer TFE2 may include a first inorganic encapsulation layer IOL1, a first organic encapsulation layer OL1, a second inorganic encapsulation layer IOL2, a second organic encapsulation layer OL2, and a third inorganic encapsulation layer IOL3.

The first inorganic encapsulation layer IOL1 may have a two-layer structure of a first sub-layer S11 and a second sub-layer S22. The first sub-layer S11 and the second sub-layer S22 may have inorganic materials different from each other.

As shown in FIG. 4C, the thin film encapsulation layer TFE3 may include a first inorganic encapsulation layer IOL10, a first organic encapsulation layer OL1, and a second inorganic encapsulation layer IOL20. The first inorganic encapsulation layer IOL10 may have a two-layer structure of a first sub-layer S10 and a second sub-layer S20. The first sub-layer S10 and the second sub-layer S20 may have inorganic materials different from each other. The second inorganic encapsulation layer IOL20 may have a two-layer structure. The second inorganic encapsulation layer IOL20 may include a first sub-layer S100 and a second sub-layer S200, which are deposited under different environments from each other. The first sub-layer S100 may be deposited under a low power source condition, and the second sub-layer S200 may be deposited under a high power source condition. The first sub-layer S100 and the second sub-layer S200 may include the same inorganic material.

Figure 5A:
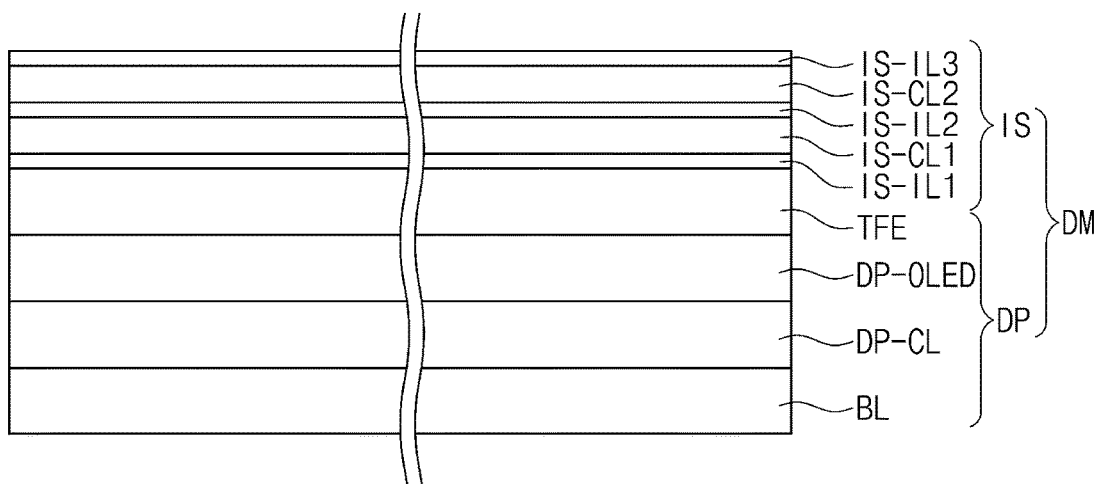
FIG. 5A is a cross-sectional view showing an input sensor according to an example embodiment of the present disclosure.
Figure 5B:
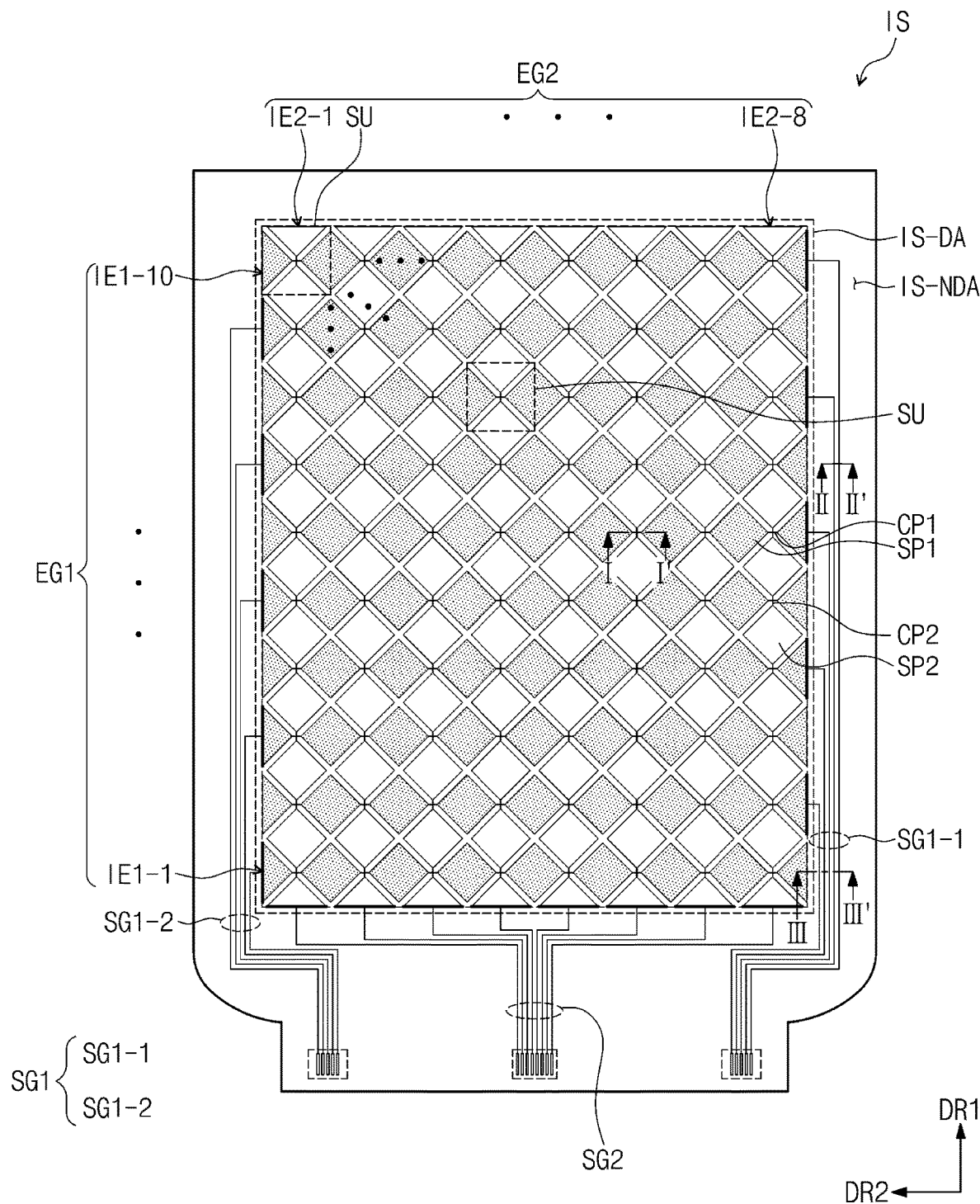
FIG. 5B is a plan view showing an input sensor according to an example embodiment of the present disclosure.
Figure 5D:
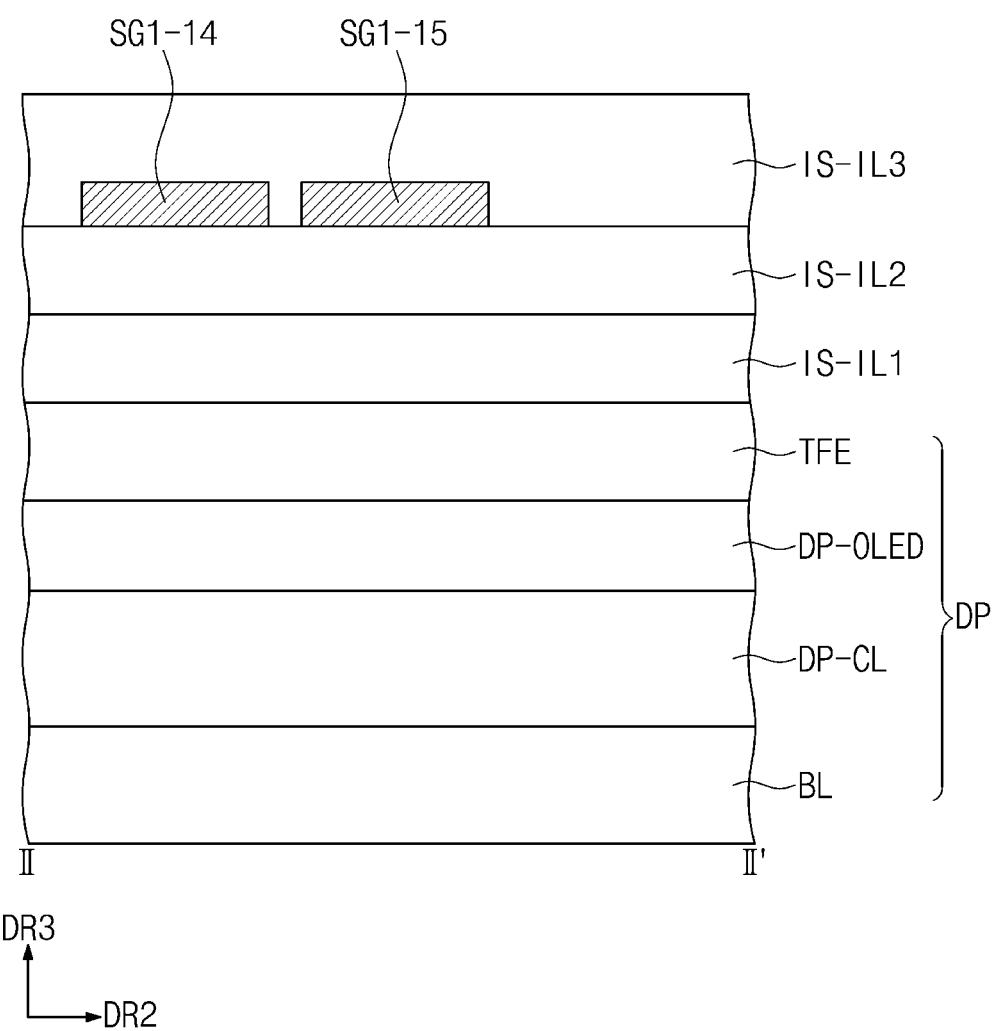
FIG. 5D is a cross-sectional view taken along a line II-II' of FIG. 5B.

FIG. 5A is a cross-sectional view showing the input sensor IS according to an example embodiment of the present disclosure. FIG. 5B is a plan view showing the input sensor IS according to an example embodiment of the present disclosure. FIG. 5C is a cross-sectional view taken along a line I-I' of FIG. 5B. FIG. 5D is a cross-sectional view taken along a line II-II' of FIG. 5B.

Referring to FIG. 5A, the input sensor IS may include a first sensing insulating layer IS-IL1, a first conductive layer IS-CL1, a second sensing insulating layer IS-IL2, a second conductive layer IS-CL2, and a third sensing insulating layer IS-IL3. The first sensing insulating layer IS-IL1 may be directly on the thin film encapsulation layer TFE. In an example embodiment of the present disclosure, the first sensing insulating layer IS-IL1 may be omitted.

Each of the first conductive layer IS-CL1 and the second conductive layer IS-CL2 may have a single-layer structure or a multi-layer structure of layers stacked in the third direction DR3. The conductive layer having the multi-layer structure may include at least two layers selected from transparent conductive layers and metal layers. The conductive layer having the multi-layer structure may include metal layers including metals different from each other. The transparent conductive layer may include indium tin oxide (ITO), indium zinc oxide (IZO), zinc oxide (ZnO), indium tin zinc oxide (ITZO), PEDOT, a metal nanowire, and/or a graphene. The metal layer may include molybdenum, silver, titanium, copper, aluminum, or any alloy thereof. For instance, each of the first conductive layer IS-CL1 and the second conductive layer IS-CL2 may have a three-layer structure of titanium/aluminum/titanium. Metals with relatively high durability and low reflectivity may be applied as a top layer of the three-layer structure, and metals with high electrical conductivity may be applied as an bottom layer of the three-layer structure.

Each of the first conductive layer IS-CL1 and the second conductive layer IS-CL2 may include a plurality of conductive patterns. Hereinafter, the first conductive layer IS-CL1 will be described as including first conductive patterns, and the second conductive layer IS-CL2 will be described as including second conductive patterns. Each of the first conductive patterns and the second conductive patterns may include sensing electrodes and signal lines connected to the sensing electrodes.

Each of the first, second, and third sensing insulating layers, IS-IL1, IS-IL2, and IS-IL3 may include an inorganic layer or an organic layer. In the present example embodiment, the first sensing insulating layer IS-IL1 and the second sensing insulating layer IS-IL2 may be an inorganic layer. The inorganic layer may include at least one of aluminum oxide, titanium oxide, silicon oxide, silicon oxynitride, zirconium oxide, or hafnium oxide. The third sensing insulating layer IS-IL3 may include an organic layer. The organic layer may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyimide-based resin, or a perylene-based resin.

In the present example embodiment, the second sensing insulating layer IS-IL2 may cover a sensing area IS-DA described in more detail below. For example, the second sensing insulating layer IS-IL2 may entirely overlap the sensing area IS-DA. In some embodiments, the second sensing insulating layer IS-IL2 may include a plurality of insulating patterns. The insulating patterns may be provided at every crossing area of sensing units SU to insulate first sensing electrodes IE1-1 to IE1-10 and second sensing electrodes IE2-1 to IE2-8.

As shown in FIG. 5B, the input sensor IS may include a first electrode group EG1, a second electrode group EG2, and signal line groups connected to the first electrode group EG1 and the second electrode group EG2. In the present example embodiment, the input sensor IS including two signal line groups SG1 and SG2 is shown as a representative example. The input sensor IS may include the sensing area IS-DA and a line area IS-NDA, which respectively correspond to the display area DP-DA and the non-display area DP-NDA of the display panel DP. The sensing area IS-DA may be defined as an area in which the first electrode group EG1 and the second electrode group EG2 are positioned. The first signal line group SG1 and the second signal line group SG2 may be in the line area IS-NDA.

In the present example embodiment, the input sensor IS may be, but is not limited to, a capacitive type (or kind) touch sensor. One group selected from the first electrode group EG1 and the second electrode group EG2 may receive a driving signal, and the other group selected from the first electrode group EG1 and the second electrode group EG2 may output a variation in capacitance between the first electrode group EG1 and the second electrode group EG2 as a sensing signal.

The first electrode group EG1 may include a plurality of first sensing electrodes IE1-1 to IE1-10. The first electrode group EG1 including ten first sensing electrodes IE1-1 to IE1-10 is shown as a representative example. The first sensing electrodes IE1-1 to IE1-10 may have a shape extending in the second direction DR2. The second electrode group EG2 may include a plurality of second sensing electrodes IE2-1 to IE2-8. The second electrode group EG2 including eight second sensing electrodes IE2-1 to IE2-8 is shown as a representative example. The second sensing electrodes IE2-1 to IE2-8 may have a shape extending in the first direction DR1. The second sensing electrodes IE2-1 to IE2-8 may have a length greater than that of the first sensing electrodes IE1-1 to IE1-10.

The first signal line group SG1 may include the same number of first signal lines as the first sensing electrodes IE1-1 to IE1-10. The first signal lines may be respectively connected to only one end of both ends of the first sensing electrodes IE1-1 to IE1-10. In the present example embodiment, both ends of the first sensing electrodes IE1-1 to IE1-10 may be connected to the first signal lines.

The second signal line group SG2 may include the same number of second signal lines as the second sensing electrodes IE2-1 to IE2-8. The second signal lines may be respectively connected to only one end of both ends of the second sensing electrodes IE2-1 to IE2-8. In the present example embodiment, the eight signal lines of the second signal line group SG2 are respectively connected to lower ends of the second sensing electrodes IE2-1 to IE2-8.

In the present example embodiment, the first signal lines may be divided into two groups. One group may be defined as a first side signal line group SG1-1, and the other group may be defined as a second side signal line group SG1-2. The first side signal line group SG1-1 may be connected to some of the first sensing electrodes IE1-1 to IE1-10, and the second side signal line group SG1-2 may be connected to others of the first sensing electrodes IE1-1 to IE1-10. The first side signal line group SG1-1 and the second side signal line group SG1-2 may be spaced apart from each other with the sensing area IS-DA interposed therebetween in the second direction DR2. As the first signal lines are provided at both sides after being divided into two groups, a width of the line area IS-NDA on each side of the sensing area IS-DA may be reduced.

The first side signal line group SG1-1 may be electrically connected to odd-numbered sensing electrodes or even-numbered sensing electrodes of the first sensing electrodes IE1-1 to IE1-10. The second side signal line group SG1-2 may be connected to the sensing electrodes that are not connected to the first side signal line group SG1-1. In the present example embodiment, five signal lines of the first side signal line group SG1-1 are respectively connected to right ends of the even-numbered first sensing electrodes.

Each of the first sensing electrodes IE1-1 to IE1-10 may include a plurality of first sensor portions SP1 and a plurality of first connection portions CP1. The first sensor portions SP1 may be arranged in the second direction DR2. Each of the first connection portions CP1 may connect two first sensor portions SP1 adjacent to each other among the first sensor portions SP1.

Each of the second sensing electrodes IE2-1 to IE2-8 may include a plurality of second sensor portions SP2 and a plurality of second connection portions CP2. The second sensor portions SP2 may be arranged in the first direction DR1. Each of the second connection portions CP2 may connect two second sensor portions SP2 adjacent to each other among the second sensor portions SP2.

Referring to FIG. 5B, the sensing area IS-DA may be divided into a plurality of sensing units SU. The sensing units SU may have the same area as each other. Each of the sensing units SU may include a corresponding crossing area among the crossing areas defined by the first sensing electrodes IE1-1 to IE1-10 and the second sensing electrodes IE2-1 to IE2-8. The crossing area may be an area in which a bridge pattern is provided.

In the example embodiment of the present disclosure, the sensing units SU may include the same mesh patterns. In the present disclosure, the mesh patterns may be defined by mesh lines of the sensing electrodes, which cross each other. In the example embodiment of the present disclosure, the sensing units SU may be classified into a plurality of groups depending on the shape of the mesh patterns in the sensing units. The sensing units included in the same group may have the same mesh patterns.

FIG. 5C shows the cross-section taken along the line I-I' of FIG. 5B. FIG. 5C shows an example in which the first connection portion CP1 crosses the second connection portion CP2. In the present example embodiment, the first connection portion CP1 may correspond to the bridge pattern. In an example embodiment of the present disclosure, the second connection portion CP2 may correspond to the bridge pattern.

Referring to FIGS. 5B and 5C, the first connection portions CP1 may be formed using the first conductive layer IS-CL1; and the first sensor portions SP1, the second sensor portions SP2, and the second connection portions CP2 may be formed using the second conductive layer IS-CL2. The first sensor portions SP1 may be connected to the first connection portions CP1 through contact holes CNT-I defined through the second sensing insulating layer IS-IL2.

In the present example embodiment, the first connection portions CP1 cross the second connection portions CP2, however, they should not be limited thereto or thereby. For instance, each of the first connection portions CP1 may be changed into a curved line shape "/\" and/or a curved line shape "\/v", so as not to overlap the second connection portions CP2. The first connection portions CP1 having the curved line shape "/\" and/or the curved line shape "\/" may overlap the second sensor portions SP2 when viewed in a plan view.

According to the present disclosure, the signal lines of the first signal line group SG1 and the second signal line group SG2 may include at least one of a portion on the same layer as the first sensing electrodes IE1-1 to IE1-10 and a portion on the same layer as the second sensing electrodes IE2-1 to IE2-8.

FIG. 5D shows the cross-section taken along the line II-II' of FIG. 5B. Fourth and fifth signal lines SG1-14 and SG1-15 of the first side signal line group SG1-1 are shown as a representative example. The signal lines of the first signal line group SG1 and the second signal line group SG2 may include at least the portion on the same layer as the second sensing electrodes IE2-1 to IE2-8. The signal lines of the first signal line group SG1 and the second signal line group SG2 may be formed using the second conductive layer IS-CL2.

The signal lines of the first signal line group SG1 and the second signal line group SG2 may further include a portion formed using the first conductive layer IS-CL1. The portion formed using the second conductive layer IS-CL2 and the portion formed using the first conductive layer IS-CL1 may be connected to each other through contact holes defined through the second sensing insulating layer IS-IL2. The signal lines having the above-mentioned two-layer structure may have a low resistance.

Figure 6A:
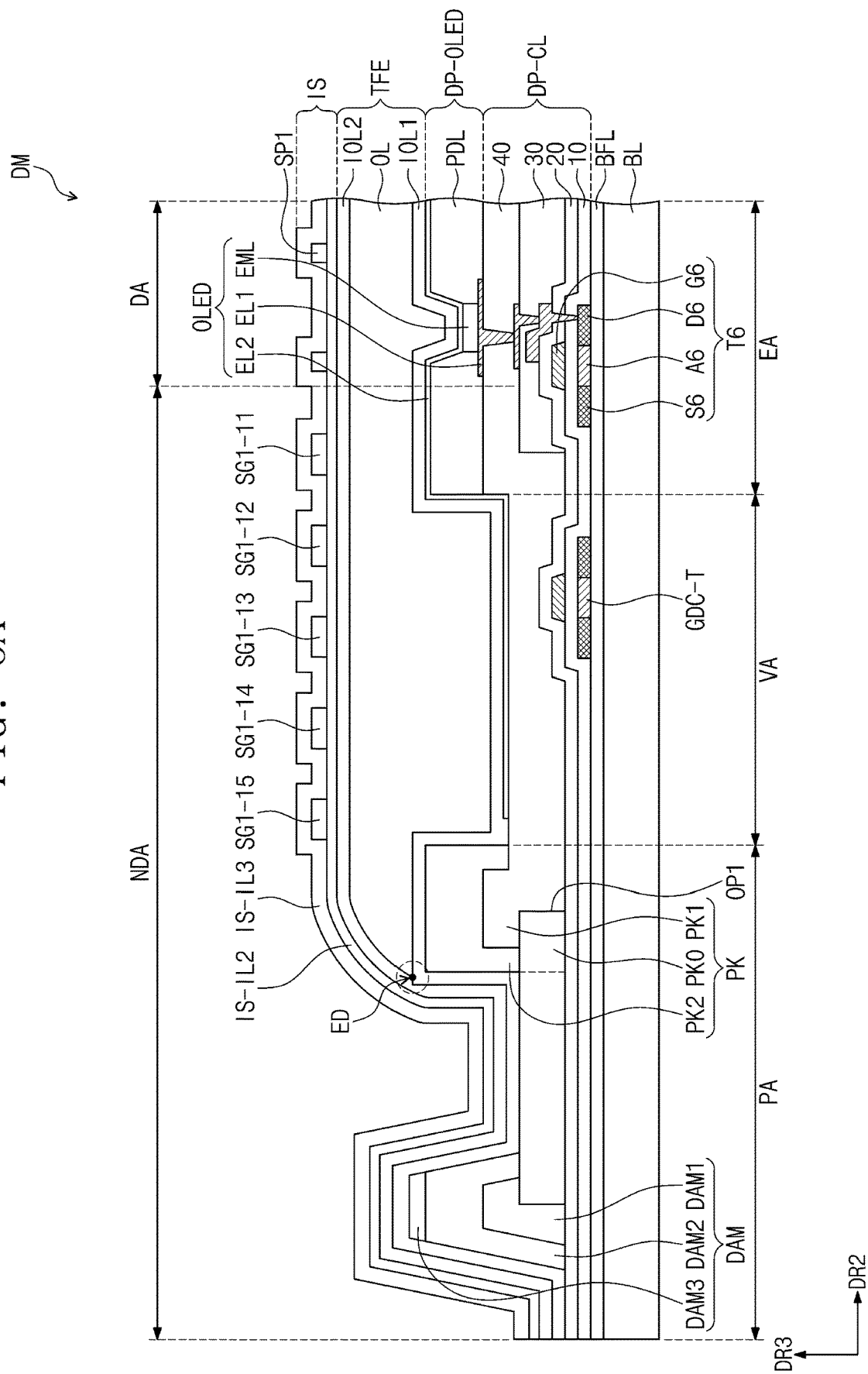
FIGS. 6A and 6B are cross-sectional views showing a display module according to an example embodiment of the present disclosure.
Figure 6B:
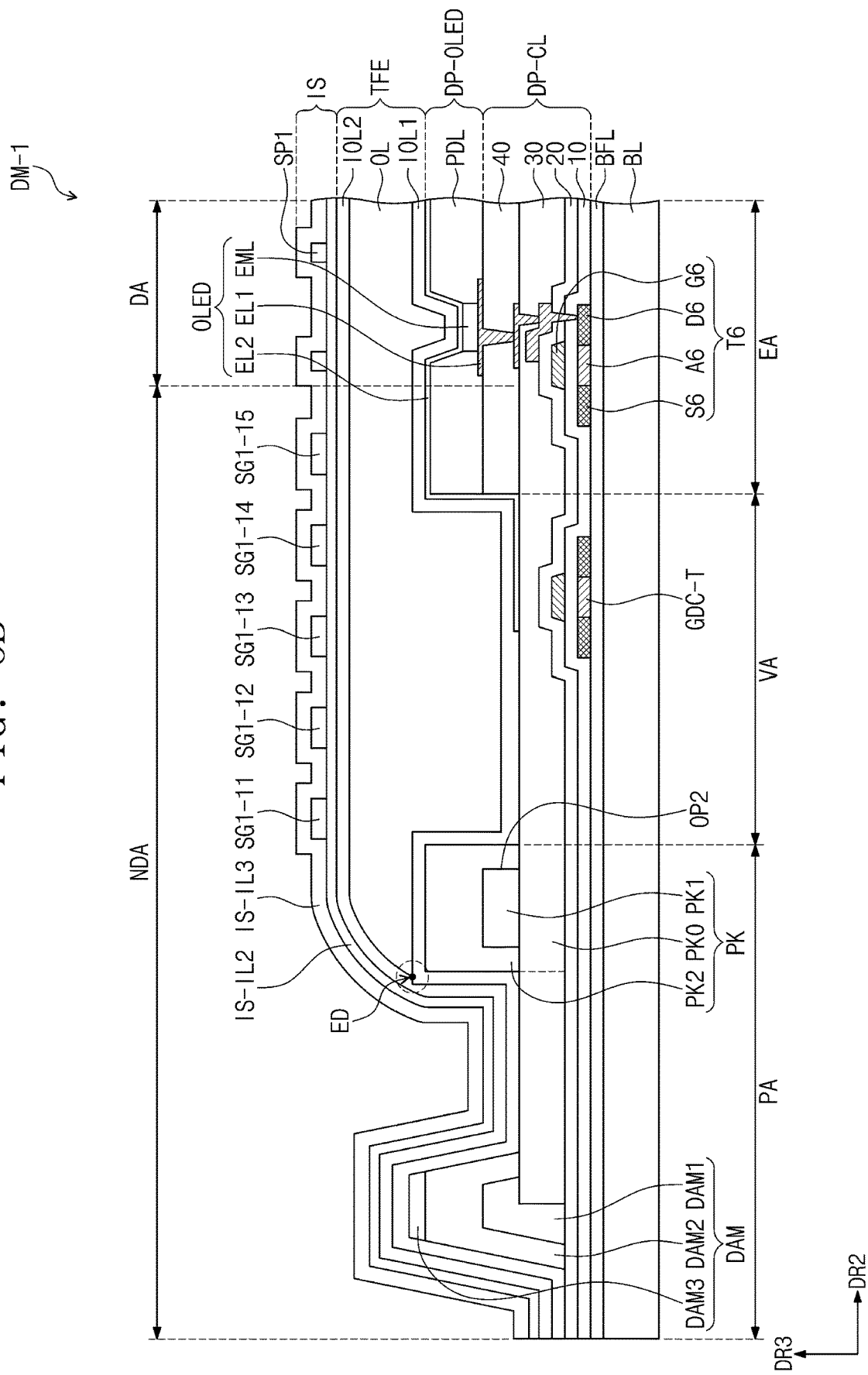

FIGS. 6A and 6B are cross-sectional views showing display modules DM and DM-1 according to example embodiments of the present disclosure.

Figure 7:
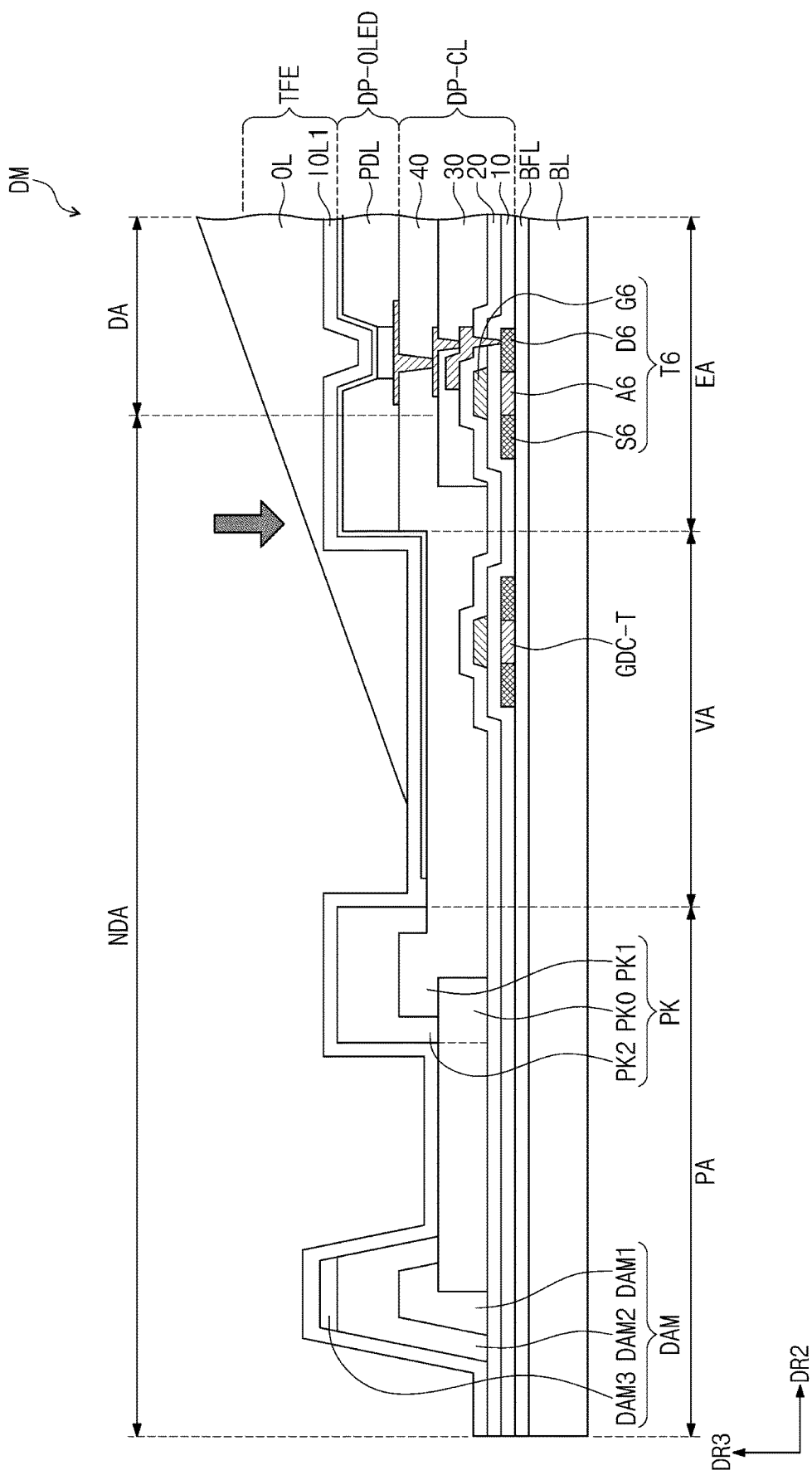
FIGS. 7-9 are partial cross-sectional views showing a display module according to example embodiments of the present disclosure.
Figure 8:
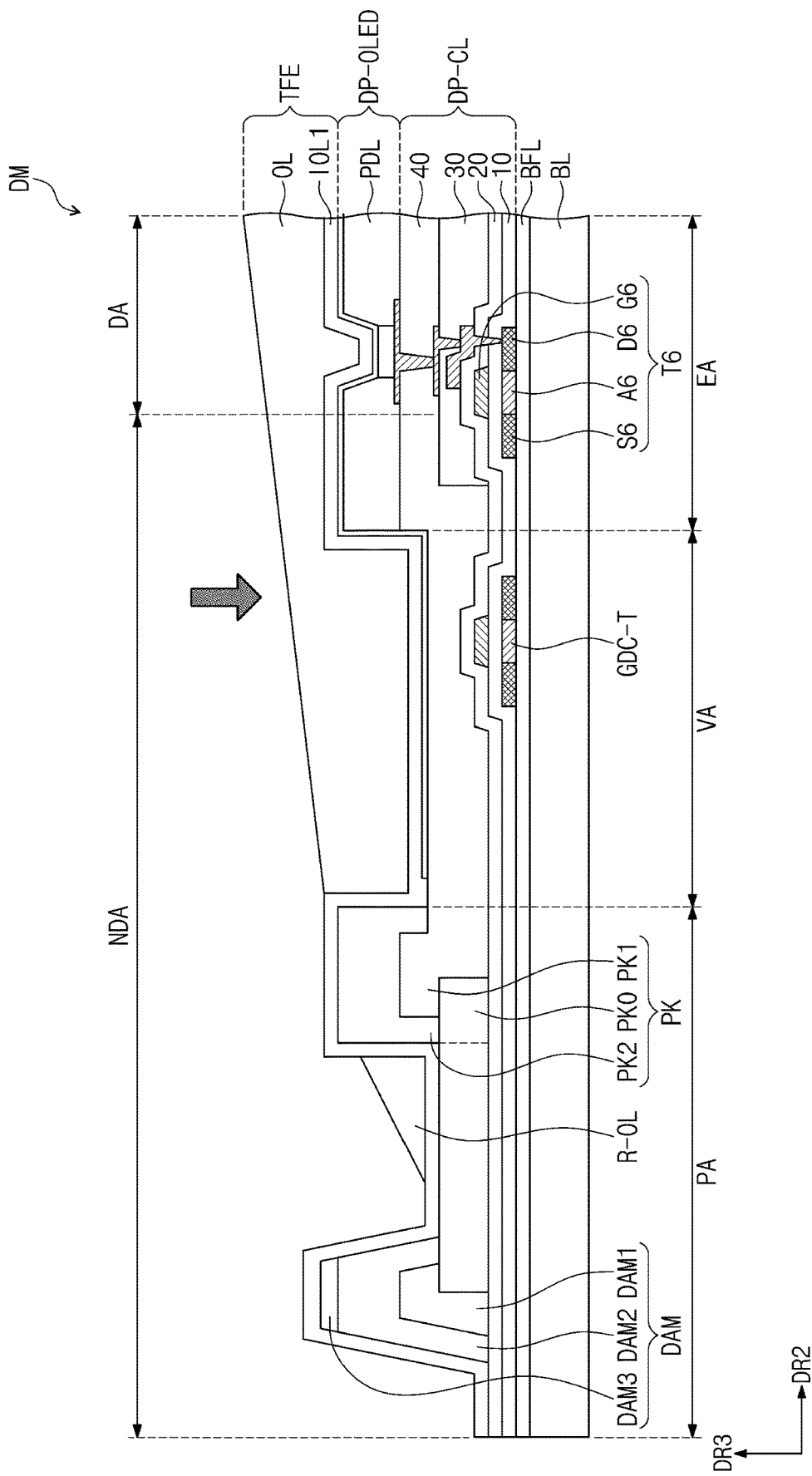
Figure 9:
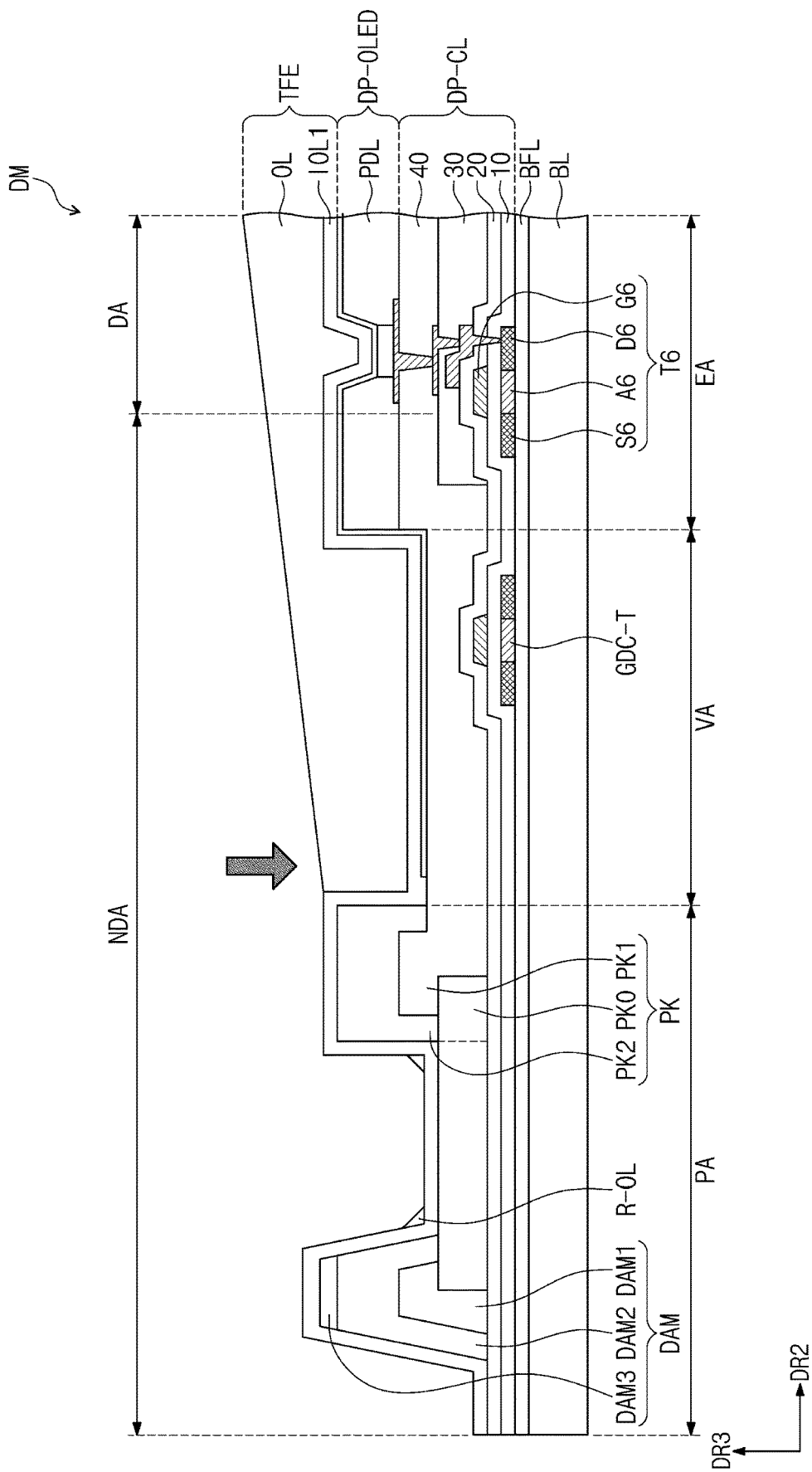

FIGS. 7 to 9 are partial cross-sectional views showing the display module DM according to an example embodiment of the present disclosure.

FIGS. 10A to 10C and 11 to 13 are cross-sectional views showing display modules DM-2, DM-3, DM-4, DM-5, DM-6, and DM-7 according to example embodiments of the present disclosure.

FIG. 6A is the cross-sectional view corresponding to a portion of the display module DM, which is taken along a line III-III' of FIG. 5B. A stacked structure of a buffer layer BFL, a circuit layer DP-CL, a light emitting element layer DP-OLED, and a thin film encapsulation layer TFE, which are in a display area DA, may be substantially the same as the stacked structure described with reference to FIGS. 3B, 4A to 4C, and thus, redundant details thereof will not be provided. However, a hole control layer HCL and an electron control layer ECL are not shown. A stacked structure of an input sensor IS in the display area DA may be also substantially the same as the configuration described with reference to FIGS. 5A to 5D, and thus, redundant details thereof will not be provided. The thin film encapsulation layer TFE including a first inorganic encapsulation layer IOL1, an organic encapsulation layer OL, and a second inorganic encapsulation layer IOL2 is shown as a representative example. Hereinafter, a non-display area NDA will be mainly described.

A scan driving circuit GDC forming the circuit layer DP-CL may be in the non-display area NDA. The scan driving circuit GDC may include at least one transistor GDC-T formed through the same process as a pixel transistor T6. The scan driving circuit GDC may include signal lines GDC-SL on the same layer as a sensing electrode of the pixel transistor T6. An initialization voltage line SL-Vint may be on the same layer as the sensing electrode of the pixel transistor T6. The initialization voltage line SL-Vint and the sensing electrode of the pixel transistor T6 may be formed through the same process, and thus, they may have the same layer structure and the same material.

A base layer BL may include a display area DA and a non-display area NDA. The non-display area NDA of the base layer BL may surround the display area DA. The non-display area NDA may be an edge portion of the display panel DP.

The circuit layer DP-CL of the example embodiment may include a first insulating layer 30 and a second insulating layer 40, which are sequentially stacked on a second intermediate insulating layer 20. The first insulating layer 30 and the second insulating layer 40 may each independently be an organic layer including an organic material. The first insulating layer 30 and the second insulating layer 40 may be patterned.

As shown in FIG. 6A, the first insulating layer 30 may be patterned on the second intermediate insulating layer 20 in the display module DM. For example, an opening OP1 may be defined through the first insulating layer 30 to expose the second intermediate insulating layer 20.

The second insulating layer 40 may be on the first insulating layer 30. Or the second insulating layer 40 may on the first insulating layer 30 and the second intermediate insulating layer 20 exposed through the opening OP1.

Accordingly, a step difference may be formed on a portion of the second insulating layer 40 due to a difference in height between the first insulating layer 30 and the second intermediate insulating layer 20. Due to the step difference, some areas of the second insulating layer 40 may have a concave shape.

The light emitting element layer DP-OLED may be formed on the circuit layer DP-CL. The light emitting element layer DP-OLED may include a light emitting area EA, a valley area VA, and a peak area PA. At least a portion of the light emitting area EA may overlap the display area DA. The valley area VA may be defined adjacent to the light emitting area EA. The valley area VA may overlap the openings OP1 and OP2 and may have a concave shape. Descriptions of the openings OP1 and OP2 are the same as those described herein. The peak area PA may be defined adjacent to the valley area VA. That is, the valley area VA may be defined between the light emitting area EA and the peak area PA. The peak area PA may overlap the non-display area NDA.

The light emitting element layer DP-OLED may include a light emitting element OLED and a pixel definition layer PDL, which are on the circuit layer DP-CL. The light emitting element OLED may include a first electrode EL1 on the circuit layer DP-CL, a light emitting layer EML on the first electrode EL1, and a second electrode EL2 on the light emitting layer EML. The pixel definition layer PDL may expose a portion of the first electrode EL1. The light emitting layer EML may be on the first electrode EL1 exposed through the pixel definition layer PDL.

In the present disclosure, layers referred to as "insulating layers" may include substantially the same material as the pixel definition layer PDL and may be formed through the same process as the pixel definition layer PDL. The insulating layer may include a light emitting area, a valley area, and a peak area. The light emitting area of the insulating layer may perform substantially the same function as the pixel definition layer PDL. For example, the insulating layer may expose a portion of the first electrode EL1 in the light emitting area. Descriptions of the light emitting area of each insulating layer may be substantially the same as those of the pixel definition layer PDL. The descriptions of the valley area VA and the peak area PA of the light emitting element layer DP-OLED may be equally applied to the valley area and the peak area of the insulating layer.

According to an embodiment, a portion of the light emitting element OLED may be in the light emitting area EA. For example, the light emitting layer EML may be in the light emitting area EA. The light emitting layer EML may overlap the display area DA. The image IM may be displayed through the display area DA by light emitted from the light emitting layer EML. Since the light emitting area EA is defined in the light emitting element layer DP-OLED, and the display area DA is defined in the base layer BL, the light emitting area EA and the display area DA may not match with each other.

The display modules DM and DM-1 may include a peak portion PK on the base layer BL and overlapping the peak area PA. The peak portion PK may include a plurality of layers. For example, the plurality of layers may include a first peak portion PK1 and a second peak portion PK2, which are sequentially stacked. According to an embodiment, at least one of the layers of the peak portion PK may be formed through the same process as one of the insulating layers 30 and 40 and the pixel definition layer PDL. The first peak portion PK1 may include the same material as the second insulating layer 40 and may be formed through the same process as the second insulating layer 40. The second peak portion PK2 may include the same material as the pixel definition layer PDL and may be formed through the same process as the pixel definition layer PDL, however, the example embodiment should not be limited thereto or thereby. The peak portion PK may further include another layer, in addition to the first peak portion PK1 and the second peak portion PK2. For example, the peak portion PK may further include a layer PK0 formed through the same process as the first insulating layer 30. As the peak portion PK includes the layer PK0 (formed through the same process as the first insulating layer 30), the first peak portion PK1, and the second peak portion PK2, the peak portion PK may have a relatively convex shape compared with the circuit layer DP-CL.

According to an example embodiment, the peak area PA may further include a dam DAM to be spaced apart from the peak portion PK. The dam DAM may include a plurality of layers. For example, the plurality of layers may include a first dam DAM1, a second dam DAM2, and a third dam DAM3, which are sequentially stacked. In the example embodiment, the first dam DAM1 may have a single-layer structure and may be formed through the same process as the second insulating layer 40. The second dam DAM2 may be on the first dam DAM1. The second dam DAM2 may have a single-layer structure and may be formed through the same process as the pixel definition layer PDL. The third dam DAM3 may be on the second dam DAM2. The third dam DAM3 may have a single-layer or a multi-layer structure. The third dam DAM3 may include an organic material.

The valley area VA may be defined between the peak area PA and the light emitting area EA. Referring to FIG. 6A, the valley area VA may be defined between the peak portion PK and the light emitting area EA above the second insulating layer 40.

As described above, the peak portion PK may include the plurality of layers, and the plurality of layers may include the layer PK0 formed through the same process as the first insulating layer 30, the first peak portion PK1, and the second peak portion PK2. Because the opening OP1 is defined through the first insulating layer 30, the step difference may occur between the first peak portion PK1 on the first insulating layer 30 and the second insulating layer 40 overlapping the opening OP1. As the valley area VA is defined as an area above the second insulating layer 40 between the peak portion PK and the light emitting area EA, the valley area VA may have the concave shape relative to the light emitting area EA and the peak portion PK, however, embodiments should not be limited thereto or thereby.

Referring to FIG. 6B, a first insulating layer 30 may be on a second intermediate insulating layer 20 in the display module DM-1. A second insulating layer 40 may be patterned on the first insulating layer 30. For example, an opening OP2 may be defined through the second insulating layer 40 to expose the first insulating layer 30. A valley area VA may be defined as an area above the first insulating layer 30 exposed through the opening OP2 defined between a peak portion PK and a light emitting area EA.

The peak portion PK may include a first peak portion PK1 formed through the same process as the second insulating layer 40. The valley area VA may have a concave shape relative to the peak portion PK and the light emitting area EA due to a difference in height between the first peak portion PK1 and the first insulating layer 30 in which the valley area VA is defined.

A thin film encapsulation layer TFE may be on a light emitting element layer DP-OLED. The thin film encapsulation layer TFE may include a first inorganic encapsulation layer IOL1, an organic encapsulation layer OL, and a second inorganic encapsulation layer IOL2.

The first inorganic encapsulation layer IOL1 may cover the light emitting area EA, the valley area VA, and a peak area PA of the light emitting element layer DP-OLED. For example, the first inorganic encapsulation layer IOL1 may cover the peak portion PK and a dam DAM of the peak area PA. The organic encapsulation layer OL may be on the first inorganic encapsulation layer IOL1 and may make contact with the first inorganic encapsulation layer IOL1. The organic encapsulation layer OL may be formed by providing a liquid organic material on the first inorganic encapsulation layer IOL1 and curing the liquid organic material. The liquid organic material may be provided by a vapor deposition, printing, or slit coating method, however, the method of forming the liquid organic material should not be limited thereto or thereby. According to another embodiment, the organic encapsulation layer OL may be formed by an inkjet process.

The peak portion PK and the dam DAM may be formed to surround an outside of the display area DA and may control the flow of the liquid organic material such that the organic encapsulation layer OL does not overflow to the outside of the display panel DP. The liquid organic material may flow from the display area DA to the peak portion PK via the valley area VA. Since the valley area VA has the concave shape and the peak portion PK has the relatively convex shape due to the plural layers stacked one on another, the step difference may be large, and it may not be easy for the liquid organic material to cross the peak portion PK. Accordingly, an end ED of the organic encapsulation layer OL may not cross between the peak portion PK and the dam DAM or outside the dam DAM. In some embodiments, the end ED of the organic encapsulation layer OL may be in contact with at least a portion of the peak portion PK.

The second inorganic encapsulation layer IOL2 may be on the organic encapsulation layer OL and may make contact with the organic encapsulation layer OL. The second inorganic encapsulation layer IOL2 may cover the light emitting area EA, the valley area VA, and the peak area PA of the light emitting element layer DP-OLED. The second inorganic encapsulation layer IOL2 may entirely overlap the first inorganic encapsulation layer IOL1. An end of the second inorganic encapsulation layer IOL2 may make contact with the first inorganic encapsulation layer IOL1. The end ED of the organic encapsulation layer OL may not be outside the peak portion PK, and thus, the first inorganic encapsulation layer IOL1 and the second inorganic encapsulation layer IOL2 may be in contact with each other in at least a portion of the peak portion PK.

According to an embodiment, an input sensor IS may be on the thin film encapsulation layer TFE. FIG. 6A shows the second sensing insulating layer IS-IL2 on the second inorganic encapsulation layer IOL2, the first sensor portions SP1, signal lines SG1-11 to SG1-15 of a signal line group SG1-1, and the third sensing insulating layer IS-IL3 as a representative example.

According to an embodiment, each of the signal lines SG1-11 to SG1-15 may not overlap the peak portion PK. In addition, a signal line SG1-11 at an outermost position of the non-display area NDA among the signal lines SG1-11 to SG1-15 may overlap the valley area VA.

Meanwhile, since the valley area VA has the concave shape relative to the light emitting area EA and the peak area PA, the valley area VA may be sufficiently filled with the liquid organic material of the organic encapsulation layer OL. For example, the organic encapsulation layer OL may be formed to have a sufficient thickness in the valley area VA. Thus, the signal lines SG1-11 to SG1-15 may overlap the organic encapsulation layer OL and may be prevented (or protected) from being short-circuited.

FIGS. 7, 8, and 9 schematically show the spread of the liquid organic material with respect to the valley area VA and the peak portion PK when the liquid organic material is injected/ejected inside and outside the valley area VA. As shown in FIG. 7, in the case where the liquid organic material is injected/ejected onto the pixel definition layer PDL, the organic encapsulation layer OL may not be sufficiently formed in the valley area VA. In other words, the organic encapsulation layer OL may not be entirely formed in the valley area VA or at least a portion of the organic encapsulation layer OL formed in the valley area VA may not have a sufficient thickness. Accordingly, at least a portion of the signal line SG1-11 to SG1-15 may be short-circuited.

Referring to FIGS. 8 and 9, in the case where the liquid organic material is injected/ejected inside the valley area VA, the organic encapsulation layer OL may be entirely formed in the valley area VA and may have a predetermined (or set) thickness in the valley area VA. The signal line SG1-11 at an outermost position among the signal line SG1-11 to SG1-15 may overlap the organic encapsulation layer OL and may be prevented (or protected) from being short-circuited. A residual organic encapsulation layer R-OL may be formed between the peak portion PK and the dam DAM, however, the liquid organic material may be prevented from overflowing to the outside of the display panel and the organic encapsulation layer OL may not be not formed outside the dam DAM.

In some embodiments, a hydrophobic or hydrophilic plasma treatment may be performed on the first inorganic encapsulation layer IOL1 to control a flow rate and a flow velocity of the liquid organic material.

Figure 10A:
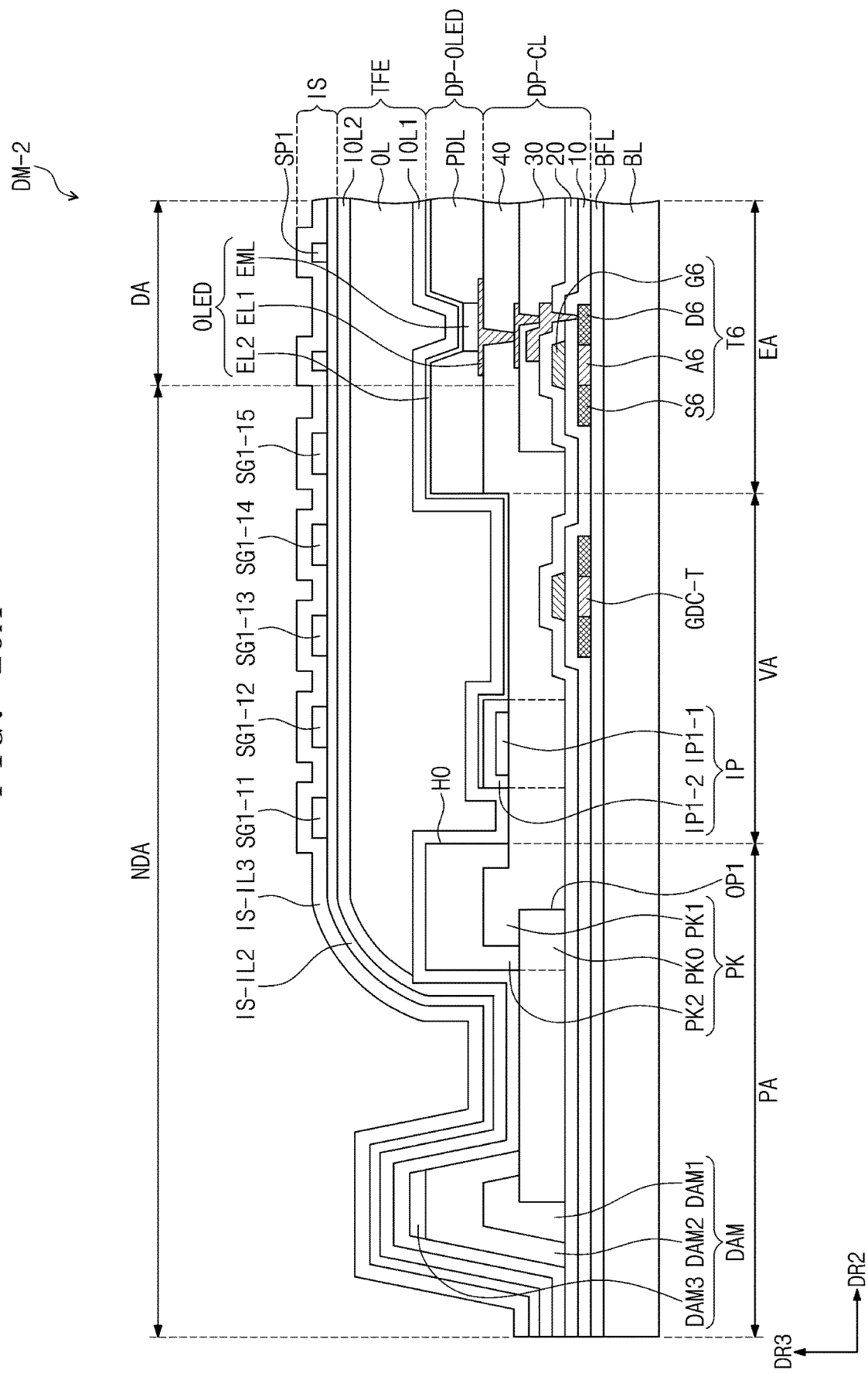
FIGS. 10A-10C and 11-13 are cross-sectional views showing a display module according to example embodiments of the present disclosure.
Figure 10B:
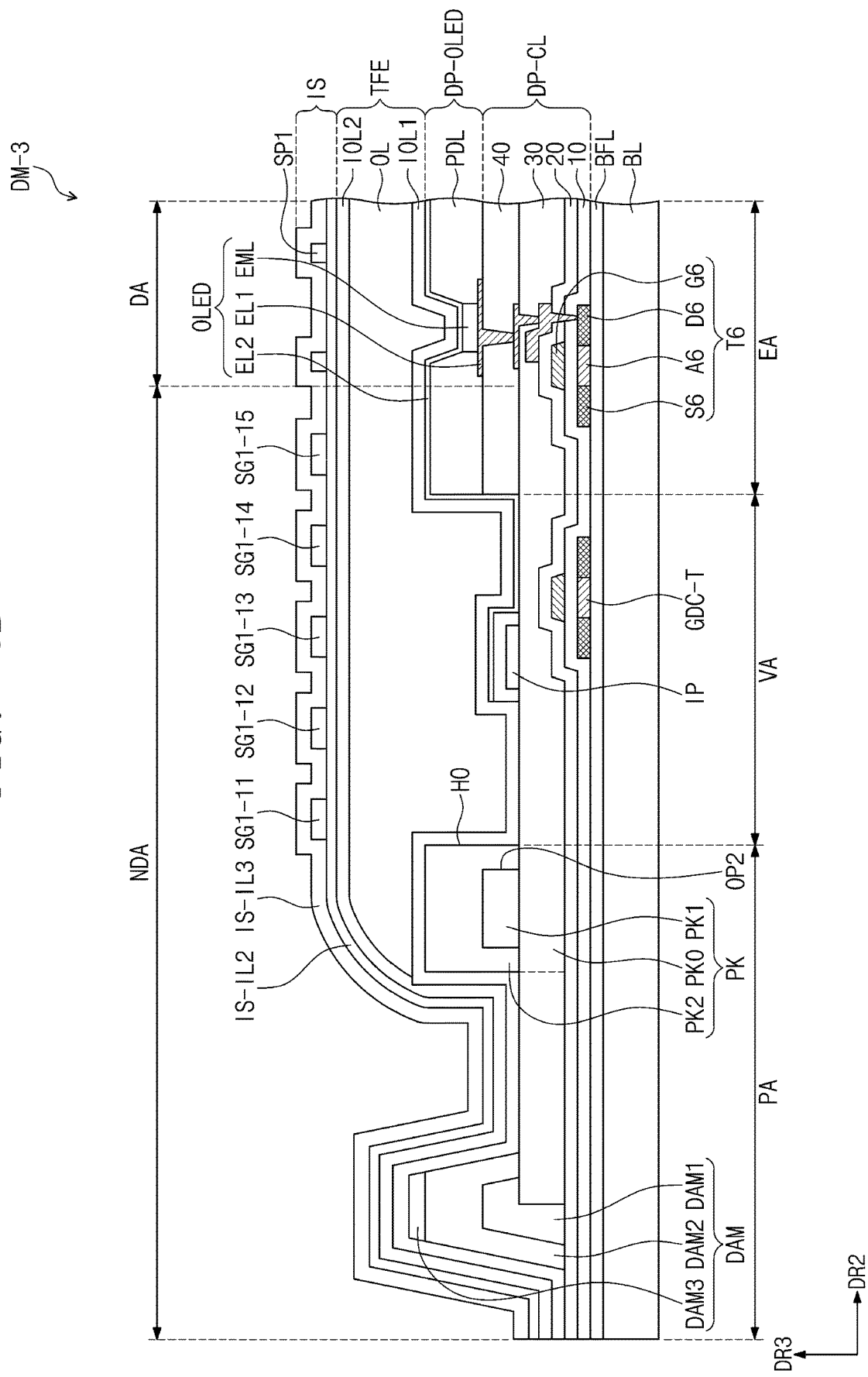
Figure 10C:
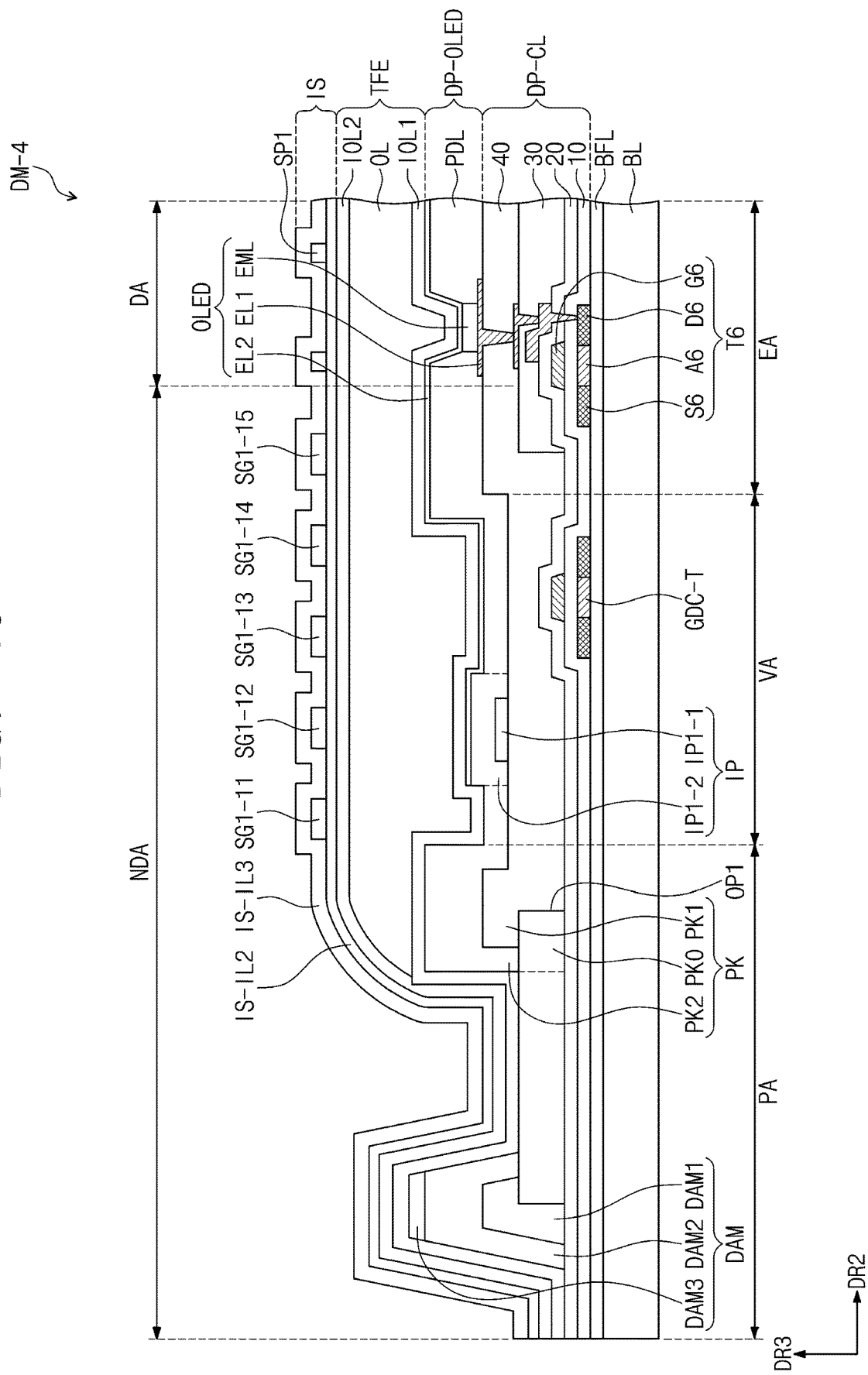
Figure 11:
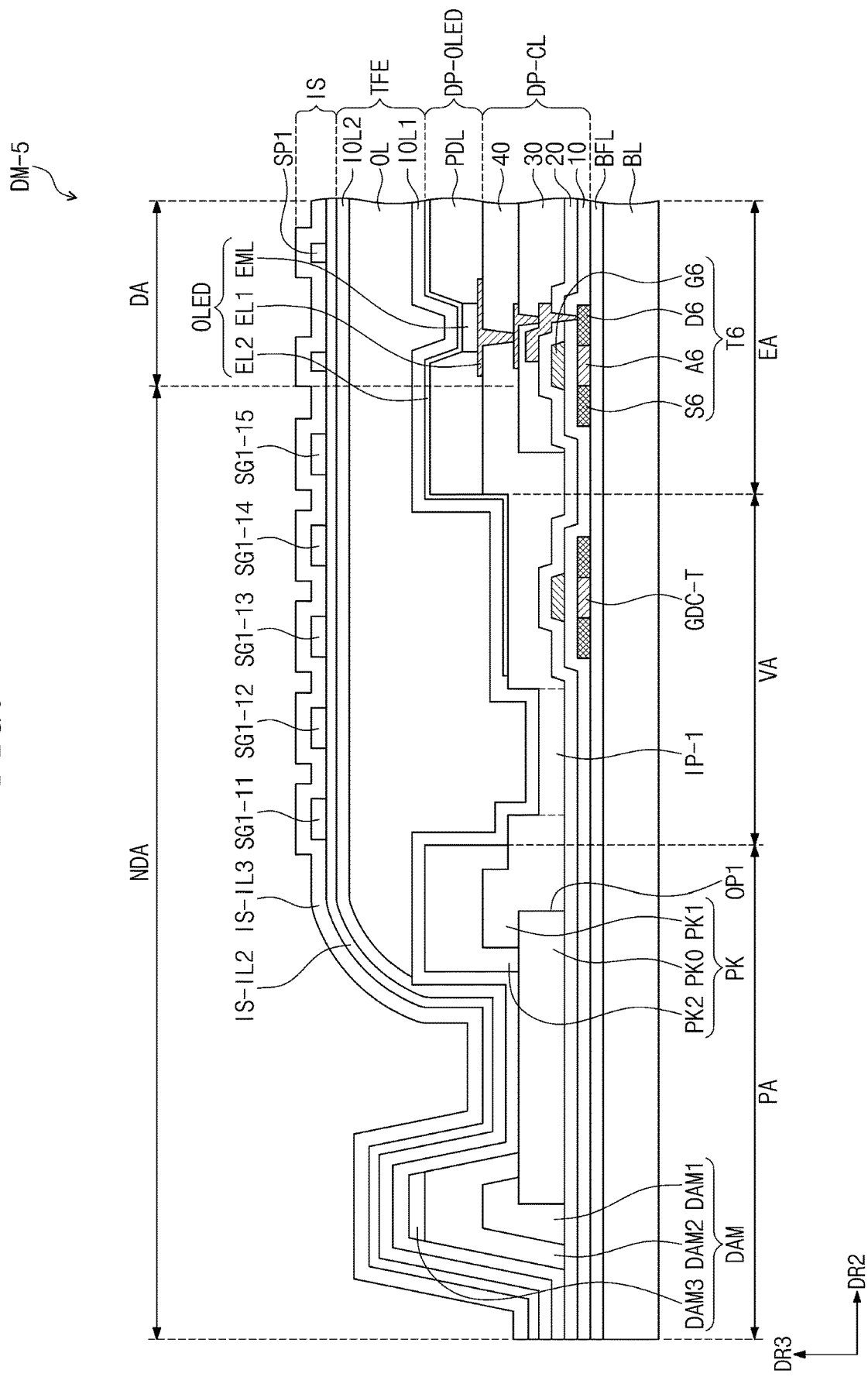
Figure 12:
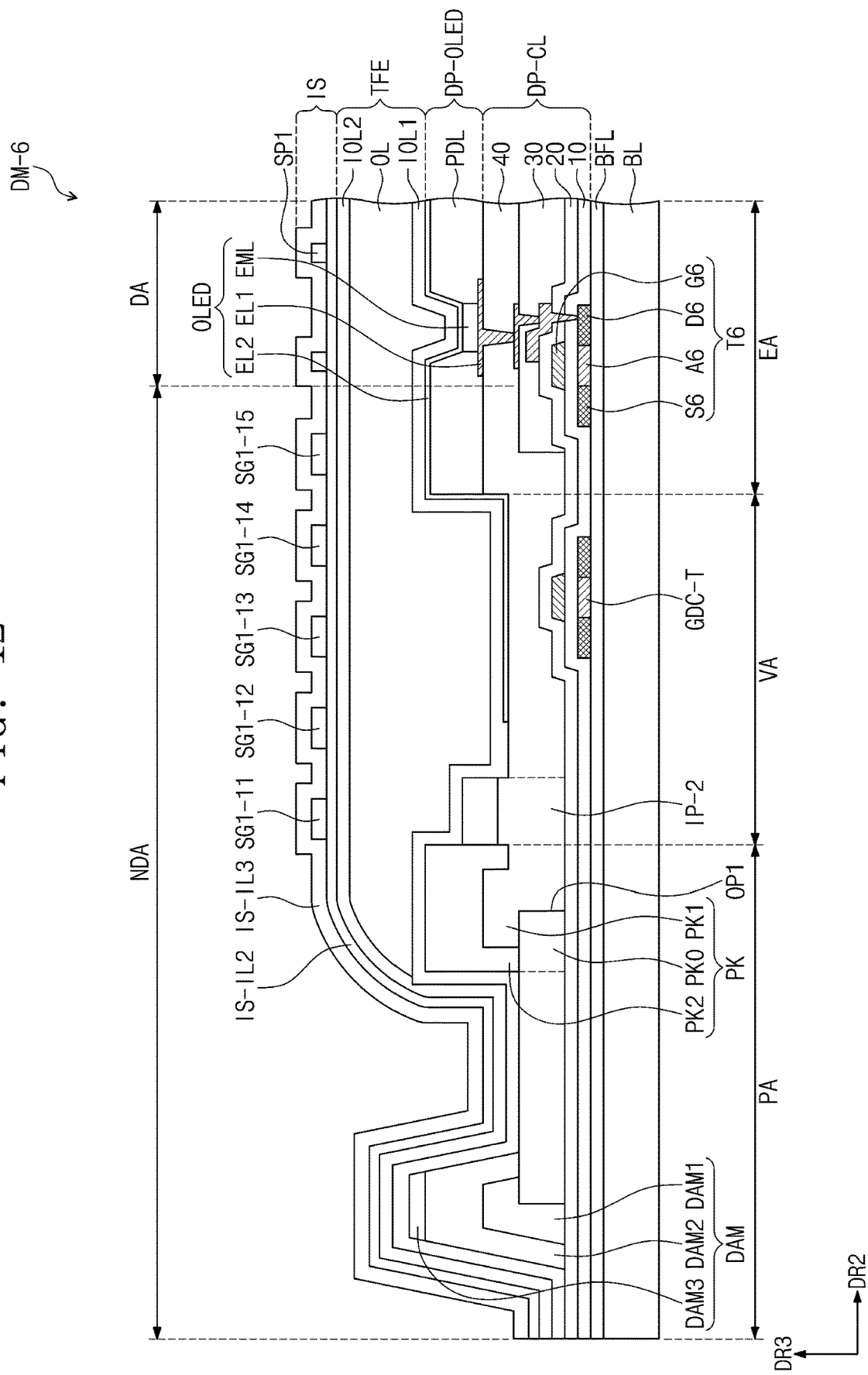
Figure 13:
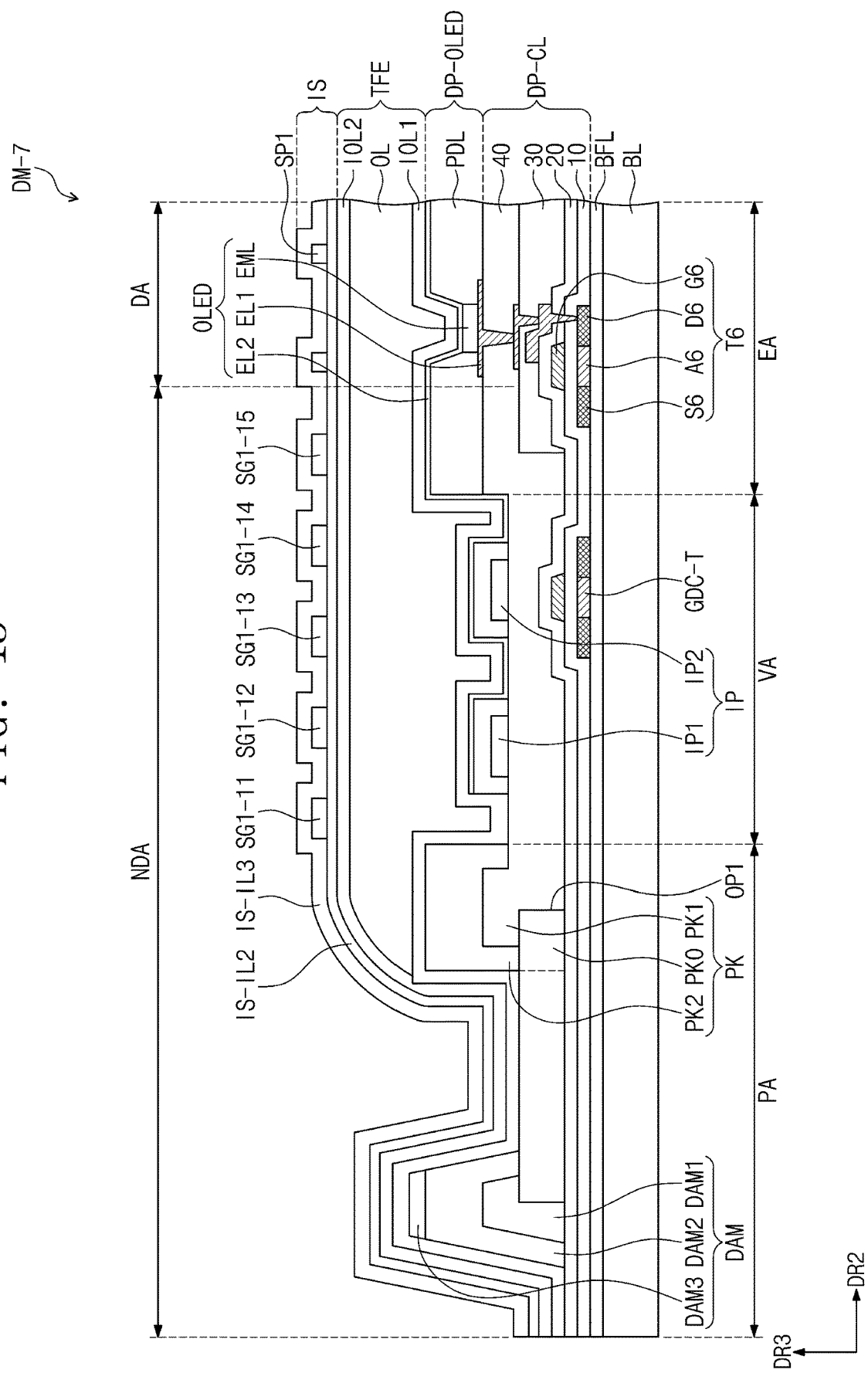

Referring to the display modules DM-2, DM-3, and DM-4 of FIGS. 10A, 10B, and 10C, an insulating pattern IP may be in an area corresponding to a valley area VA. In the display module DM-2 of FIG. 10A, an opening OP1 may be defined through a first insulating layer 30, and the valley area VA may be defined on a second insulating layer 40. One or more insulating patterns IP may be on the second insulating layer 40 in the valley area VA. The insulating pattern IP may have a height lower than a height of a peak portion PK.

According to an example embodiment, the insulating pattern IP may include one or more layers. For example, the insulating pattern IP may include a plurality of layers. For example, the insulating pattern IP may include a first insulating pattern layer IP1-1 and a second insulating pattern layer IP1-2, which are sequentially stacked. In the example embodiment, at least one of the layers of the insulating pattern IP may be formed through the same process as one of the insulating layers 30 and 40 and a pixel definition layer PDL. For example, the first insulating pattern layer IP1-1 may be formed through the same process as the second insulating layer 40 and may include the same material as the second insulating layer 40. The second insulating pattern layer IP1-2 may be formed through the same process as the pixel definition layer PDL and may include the same material as the pixel definition layer PDL. However, the example embodiment should not be limited thereto or thereby.

The insulating pattern IP may control the flow rate and the flow velocity of the liquid organic material. For example, the insulating pattern IP may reduce the flow velocity of the liquid organic material. As the insulating pattern IP is in the valley area VA, the velocity of the liquid organic material flowing toward an end of a base layer BL may be reduced. According to an example embodiment, the insulating pattern IP, which is protruded, may compensate for the thickness of the organic encapsulation layer OL, and thus, the organic encapsulation layer OL may have a substantially uniform thickness in a non-display area NDA, which corresponds to a dropping point of the injected/ejected liquid organic material.

Referring to FIG. 10B, an opening OP2 may be defined through a second insulating layer 40 in the display module DM-3. A valley area VA may be defined as an area on a first insulating layer 30 exposed through a hole HO between the second insulating layer 40 and the peak portion PK. Accordingly, an insulating pattern IP may be on the first insulating layer 30.

Referring to FIG. 10C, a light emitting element layer DP-OLED of the display module DM-4 may include a light emitting element OLED and a pixel definition layer PDL. The pixel definition layer PDL may include a light emitting area, a valley area, and a peak area. The pixel definition layer PDL may expose a portion of a first electrode EL1 in the light emitting area.

In a case where the pixel definition layer PDL is described as including the light emitting area, the valley area, and the peak area, the above descriptions of the light emitting area EA, the valley area VA, and the peak area PA may be respectively applied to the light emitting area, the valley area, and the peak area of the pixel definition layer PDL. For example, the display modules DM-2 and DM-3 of FIGS. 10A and 10B may have the structure in which a hole HO is defined through the pixel definition layer PDL in the valley area VA. The display module DM-4 of FIG. 10C may have a structure in which no hole is defined through the pixel definition layer PDL in the valley area VA. For example, the pixel definition layer PDL of the display module DM-4 may extend to the non-display area NDA, may be connected to a second insulating pattern layer IP1-2 of the insulating pattern IP and a second peak portion PK2 of a peak portion PK, and may cover the valley area VA and the peak portion PK.

As described above, the second insulating pattern layer IP1-2 of the insulating pattern IP and the second peak portion PK2 of the peak portion PK may be formed through the same process as the pixel definition layer PDL. Therefore, the pixel definition layer PDL may be connected to the second insulating pattern layer IP1-2 and the second peak portion PK2 in FIG. 10C.

The insulating pattern IP may be provided in the valley area VA without limitation in number and location. Referring to the display module DM-5 of FIG. 11, an insulating pattern IP-1 may have a convex shape extending downward. Referring to the display module DM-6 of FIG. 12, an insulating pattern IP-2 may be in contact with a peak portion PK. The peak portion PK and the insulating pattern IP-2 together may have a step shape. Referring to the display module DM-7 of FIG. 13, a plurality of insulating patterns IP may be in a valley area VA. The insulating patterns IP may include a first insulating pattern IP1 and a second insulating pattern IP2. The first insulating pattern IP1 and the second insulating pattern IP2 may be to be spaced apart from each other.

The display modules DM, DM-1, DM-2, DM-3, DM-4, DM-5, DM-6, and DM-7 according to the example embodiments of the present disclosure may include at least one of the peak portion PK, the valley area VA, or the insulating pattern IP. Thus, the flow rate and the flow velocity of the liquid organic material of the organic encapsulation layer OL may be controlled, and the signal line SG1-11 to SG1-15 may be prevented or protected from being short-circuited.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The device and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the [device] may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

Although the example embodiments of the present disclosure have been described, it is understood that the present disclosure should not be limited to these example embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the attached claims and their equivalents.

What is claimed is:

1. A display device comprising:
    a base layer comprising a display area and a non-display area adjacent to the display area;
    a circuit layer on the base layer, the circuit layer comprising a plurality of insulating layers of which at least one layer is with an opening defined therethrough, the opening overlapping the non-display area;
    a light emitting element layer on the circuit layer, the light emitting element layer comprising a light emitting area of which at least a portion overlaps the display area, a valley area overlapping the opening and having a concave shape, and a peak area overlapping the non-display area; and
    a thin film encapsulation layer on the light emitting element layer, the thin film encapsulation layer comprising an organic encapsulation layer covering the light emitting area, the valley area, and at least a portion of the peak area,
    wherein the light emitting element layer comprises:
        a light emitting element comprising a first electrode on the circuit layer, a light emitting layer on the first electrode, and a second electrode on the light emitting layer; and
        a pixel definition layer exposing a portion of the first electrode.

2. The display device of claim 1, further comprising an input sensor on the thin film encapsulation layer, the input sensor comprising a plurality of sensing electrodes and a plurality of signal lines connected to the plurality of sensing electrodes,
    wherein a signal line of the plurality of signal lines at an outermost position of the non-display area overlaps the valley area.

3. The display device of claim 1, wherein the plurality of insulating layers comprise:
    a first insulating layer with the opening defined therethrough; and
    a second insulating layer on the first insulating layer to cover the opening, a portion of the second insulating layer having a concave shape and overlapping the opening, and
    wherein the valley area is defined on the portion of the second insulating layer having the concave shape.

4. The display device of claim 1, wherein the plurality of insulating layers comprise:
    a first insulating layer; and
    a second insulating layer with the opening defined therethrough, the second insulating layer being on the first insulating layer, and
    wherein the valley area is defined on a portion of the first insulating layer exposed through the opening.

5. The display device of claim 1, further comprising a peak portion on the base layer, the peak portion overlapping the peak area,
    wherein the peak portion comprises a plurality of layers, and at least one of the plurality of layers of the peak portion is formed through the same process as that of one of the pixel definition layer or the plurality of insulating layers.

6. The display device of claim 5, further comprising a dam overlapping the peak area and spaced apart from the peak portion,
    wherein the dam comprises a plurality of layers, and at least one of the plurality of layers of the dam is formed through the same process as that of one of the pixel definition layer or the plurality of insulating layers.

7. The display device of claim 5, wherein the thin film encapsulation layer further comprises a first inorganic encapsulation layer and a second inorganic encapsulation layer,
    wherein the organic encapsulation layer is between the first inorganic encapsulation layer and the second inorganic encapsulation layer, and
    wherein the first inorganic encapsulation layer and the second inorganic encapsulation layer contact each other in at least a portion of the peak portion.

8. The display device of claim 5, wherein the valley area comprises an insulating pattern,
    the insulating pattern comprises a plurality of layers, at least one of the plurality of layers of the insulating pattern is formed through the same process as that of one of the pixel definition layer or the plurality of insulating layers, and
    a distance from the base layer to the insulating pattern is smaller than a distance from the base layer to the peak portion.

9. The display device of claim 8, wherein the insulating pattern comprises a first insulating pattern and a second insulating pattern spaced apart from the first insulating pattern.

10. The display device of claim 8, wherein the insulating pattern contacts the peak portion.

11. The display device of claim 1, wherein the light emitting layer and the pixel definition layer are in the light emitting area.

12. The display device of claim 1, wherein the light emitting layer is in the light emitting area, and the pixel definition layer is in the light emitting area, the valley area, and the peak area.

13. A display device comprising:
    a base layer comprising a display area and a non-display area adjacent to the display area;
    a plurality of insulating layers of which at least one layer is with an opening defined therethrough, the opening overlapping the non-display area;
    a light emitting element of which at least a portion overlaps the display area and is on the plurality of insulating layers;
    a pixel definition layer on the plurality of insulating layers, the pixel definition layer comprising a light emitting area, a valley area overlapping the opening and having a concave shape, and a peak area overlapping the non-display area; and
    a thin film encapsulation layer on the light emitting element, the thin film encapsulation layer comprising an organic encapsulation layer covering the light emitting area, the valley area, and at least a portion of the peak area.

14. The display device of claim 13, further comprising an input sensor on the thin film encapsulation layer, the input sensor comprising a plurality of sensing electrodes and a plurality of signal lines connected to the plurality of sensing electrodes,
    wherein a signal line of the plurality of signal lines at an outermost position of the non-display area overlaps the valley area.

15. The display device of claim 13, wherein the light emitting element comprises:
    a first electrode on the plurality of insulating layers;
    a light emitting layer on the first electrode and overlapping the display area; and
    a second electrode on the light emitting layer, and wherein the pixel definition layer exposes a portion of the first electrode in the light emitting area.

16. The display device of claim 13, wherein the plurality of insulating layers comprise:
a first insulating layer with the opening defined therethrough; and
a second insulating layer on the first insulating layer to cover the opening, a portion of the second insulating layer having a concave shape and overlapping the opening, and
wherein the valley area is defined on the portion of the second insulating layer having the concave shape.

17. The display device of claim 13, wherein the plurality of insulating layers comprise:
a first insulating layer; and
a second insulating layer with the opening defined therethrough, the second insulating layer being on the first insulating layer, and
wherein the valley area is defined on a portion of the first insulating layer exposed through the opening.

18. The display device of claim 13, further comprising a peak portion on the base layer, the peak portion overlapping the peak area,
wherein the peak portion comprises a plurality of layers, and at least one of the plurality of layers of the peak portion is formed through the same process as that of one of the pixel definition layer or the plurality of insulating layers.

19. The display device of claim 18, wherein the thin film encapsulation layer comprises a first inorganic encapsulation layer, an organic encapsulation layer, and a second inorganic encapsulation layer, which are sequentially arranged on the base layer,
the organic encapsulation layer covers a portion of the peak portion, the valley area, and the light emitting element, and
the first inorganic encapsulation layer and the second inorganic encapsulation layer contact each other in at least a portion of the peak portion.

20. The display device of claim 18, wherein the valley area comprises an insulating pattern, and
a distance from the base layer to the insulating pattern is smaller than a distance from the base layer to the peak portion.

21. The display device of claim 13, wherein the pixel definition layer is with a hole defined therethrough in the valley area.

22. A display device comprising:
a base layer comprising a display area and a non-display area adjacent to the display area;
a circuit layer on the base layer, the circuit layer comprising a plurality of insulating layers;
a light emitting element overlapping the display area, the light emitting element comprising a first electrode, a light emitting layer, and a second electrode, which are on the circuit layer;
a pixel definition layer on the plurality of insulating layers, the pixel definition layer exposing the first electrode;
a peak portion in the non-display area and spaced apart from the light emitting element;
a thin film encapsulation layer covering the peak portion, the light emitting element, and the pixel definition layer;

a plurality of sensing electrodes on the thin film encapsulation layer; and
a plurality of signal lines connected to the plurality of sensing electrodes,
wherein at least one insulating layer among the plurality of insulating layers is with an opening defined therethrough, the opening overlapping the non-display area,
an area between the peak portion and the light emitting element and overlapping the opening is defined as a valley area, and
at least one signal line among the plurality of signal lines overlaps the valley area.

23. The display device of claim 22, wherein the thin film encapsulation layer comprises a first inorganic encapsulation layer, an organic encapsulation layer, and a second inorganic encapsulation layer, which are sequentially arranged on the base layer,
the organic encapsulation layer covers a portion of the peak portion, the valley area, and the light emitting element, and
the first inorganic encapsulation layer and the second inorganic encapsulation layer contact each other in at least a portion of the peak portion.

24. The display device of claim 22, wherein the plurality of insulating layers comprise:
a first insulating layer with the opening defined therethrough; and
a second insulating layer on the first insulating layer to cover the opening, a portion of the second insulating layer having a concave shape overlapping the opening, and
wherein the valley area is defined on the portion of the second insulating layer having the concave shape.

25. The display device of claim 22, wherein the plurality of insulating layers comprise:
a first insulating layer; and
a second insulating layer with the opening defined therethrough, the second insulating layer being on the first insulating layer, and
wherein the valley area is defined on a portion of the first insulating layer exposed through the opening.

26. The display device of claim 22, wherein the peak portion comprises a plurality of layers, and at least one of the plurality of layers of the peak portion is formed through the same process as that of one of the pixel definition layer or the plurality of insulating layers.

27. The display device of claim 26, wherein the valley area comprises an insulating pattern,
the insulating pattern comprises a plurality of layers, at least one of the plurality of layers of the insulating pattern is formed through the same process as that of one of the pixel definition layer or the plurality of insulating layers, and
a distance from the base layer to the insulating pattern is smaller than a distance from the base layer to the peak portion.

28. The display device of claim 27, wherein the insulating pattern comprises a first insulating pattern and a second insulating pattern spaced apart from the first insulating pattern.

29. The display device of claim 26, wherein the valley area comprises an insulating pattern, and the insulating pattern has a concave shape.

* * * * *